(12) United States Patent
Miyamoto et al.

(10) Patent No.: US 10,349,531 B2
(45) Date of Patent: *Jul. 9, 2019

(54) CARRIER-ATTACHED COPPER FOIL, LAMINATE, LAMINATE PRODUCING METHOD, PRINTED WIRING BOARD PRODUCING METHOD, AND ELECTRONIC DEVICE PRODUCING METHOD

(71) Applicant: JX Nippon Mining & Metals Corporation, Tokyo (JP)

(72) Inventors: Nobuaki Miyamoto, Ibaraki (JP); Michiya Kohiki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/209,930

(22) Filed: Jul. 14, 2016

(65) Prior Publication Data
US 2017/0019991 A1 Jan. 19, 2017

(30) Foreign Application Priority Data
Jul. 16, 2015 (JP) .................................. 2015-142247

(51) Int. Cl.
*H05K 3/40* (2006.01)
*H05K 3/20* (2006.01)
(Continued)

(52) U.S. Cl.
CPC .......... *H05K 3/4038* (2013.01); *H05K 3/205* (2013.01); *H05K 3/4007* (2013.01); *H05K 3/0035* (2013.01); *H05K 3/188* (2013.01)

(58) Field of Classification Search
None
See application file for complete search history.

(56) References Cited

U.S. PATENT DOCUMENTS

| 5,431,803 A | 7/1995 | DiFranco et al. |
|---|---|---|
| 7,026,059 B2 | 4/2006 | Suzuki et al. |

(Continued)

FOREIGN PATENT DOCUMENTS

| CN | 104125711 A | 10/2014 |
|---|---|---|
| EP | 1152070 A1 | 11/2001 |

(Continued)

OTHER PUBLICATIONS

Office action dated Jan. 24, 2018 in co-pending U.S. Appl. No. 15/218,449.

(Continued)

*Primary Examiner* — Evren Seven
(74) *Attorney, Agent, or Firm* — Nields, Lemack & Frame, LLC

(57) ABSTRACT

Provided herein is a carrier-attached copper foil having desirable laser drillability through an ultrathin copper layer, preferred for fabrication of a high-density integrated circuit substrate. The carrier-attached copper foil includes an interlayer and an ultrathin copper layer that are provided in this order on one or both surfaces of a carrier. The surface roughness Sz and the surface roughness Sa on the interlayer side of the ultrathin copper layer satisfy Sz≤3.6 μm, and Sz/Sa≤14.00 as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours. GMD, which is a 60-degree glossiness of the ultrathin copper layer surface on the interlayer side in MD direction, satisfies GMD≤150 in case of detaching the carrier from the carrier-attached copper foil according to JIS C 6471 after the carrier-attached copper foil is laminated using the same procedure.

18 Claims, 5 Drawing Sheets

(51) Int. Cl.
*H05K 3/18* (2006.01)
*H05K 3/00* (2006.01)

(56) References Cited

U.S. PATENT DOCUMENTS

| | | | |
|---|---|---|---|
| 9,955,583 B2 * | 4/2018 | Ishii | B32B 15/08 |
| 10,123,433 B2 | 11/2018 | Moriyama et al. | |
| 2001/0042732 A1 | 11/2001 | Yamamoto et al. | |
| 2003/0148136 A1 | 8/2003 | Yamamoto et al. | |
| 2004/0038049 A1 | 2/2004 | Suzuki et al. | |
| 2004/0067377 A1 | 4/2004 | Sugimoto et al. | |
| 2004/0241487 A1 | 12/2004 | Nagatani | |
| 2005/0048306 A1 | 3/2005 | Suzuki et al. | |
| 2005/0158574 A1 | 7/2005 | Suzuki et al. | |
| 2007/0230130 A1 * | 10/2007 | Alcoe | H01L 23/3735 361/704 |
| 2010/0084275 A1 | 4/2010 | Hanafusa | |
| 2011/0209903 A1 * | 9/2011 | Uno | B32B 15/01 174/255 |
| 2011/0262764 A1 | 10/2011 | Arai et al. | |
| 2011/0311834 A1 | 12/2011 | Hanafusa | |
| 2012/0125667 A1 * | 5/2012 | Jung | H05K 3/4644 174/251 |
| 2012/0285734 A1 | 11/2012 | Uno et al. | |
| 2013/0040162 A1 * | 2/2013 | Fujisawa | B32B 15/01 428/607 |
| 2013/0220679 A1 | 8/2013 | Kawakami | |
| 2013/0220685 A1 * | 8/2013 | Kohiki | H05K 3/38 174/257 |
| 2016/0120017 A1 * | 4/2016 | Momoi | H01L 23/3735 361/720 |
| 2016/0183380 A1 | 6/2016 | Ishii et al. | |
| 2016/0211195 A1 * | 7/2016 | Sunachi | H05K 3/3431 |
| 2016/0370133 A1 * | 12/2016 | Liu | F28F 21/081 |
| 2017/0032978 A1 | 2/2017 | Moriyama et al. | |
| 2017/0034926 A1 | 2/2017 | Moriyama et al. | |
| 2017/0042025 A1 | 2/2017 | Miyamoto | |
| 2017/0042036 A1 | 2/2017 | Miyamoto | |
| 2017/0042044 A1 | 2/2017 | Miyamoto | |
| 2017/0198991 A1 * | 7/2017 | Oki | H01L 23/3736 |
| 2018/0279482 A1 | 9/2018 | Ishii et al. | |

FOREIGN PATENT DOCUMENTS

| | | |
|---|---|---|
| JP | 3261119 B2 | 2/2002 |
| JP | 2005-161840 A | 6/2005 |
| JP | 2006-22406 A | 1/2006 |
| JP | 2006-346874 A | 12/2006 |
| JP | 2007-7937 A | 1/2007 |
| JP | 2010-6071 A | 1/2010 |
| JP | 5352748 B1 | 11/2013 |
| JP | 2014-100905 A | 6/2014 |
| JP | 2014-131808 A | 7/2014 |
| JP | 2014-208910 A | 11/2014 |
| JP | 2015-42765 A | 3/2015 |
| JP | 2015-61938 A | 4/2015 |
| JP | 2016-89193 A | 5/2016 |
| KR | 2014-0053797 A | 5/2014 |
| TW | 201446488 A | 12/2014 |
| WO | 2004/005588 A1 | 1/2004 |
| WO | 2012/046804 A1 | 4/2012 |
| WO | 2014/065430 A1 | 5/2014 |
| WO | 2014/196576 A1 | 12/2014 |
| WO | 2015/012327 A1 | 1/2015 |
| WO | 2015/108191 A1 | 7/2015 |

OTHER PUBLICATIONS

Office action dated Aug. 25, 2017 in co-pending U.S. Appl. No. 15/218,466.
Office action dated May 21, 2018 in co-pending U.S. Appl. No. 15/229,203.
Final rejection dated Mar. 12, 2018 in co-pending U.S. Appl. No. 15/218,466.
Notice of allowance dated Jun. 25, 2018 in co-pending U.S. Appl. No. 15/218,449.
Notice of allowance dated Jun. 25, 2018 in co-pending U.S. Appl. No. 15/218,466.
Office action dated Jun. 15, 2018 in co-pending U.S. Appl. No. 15/229,194.
Office action dated Jul. 11, 2018 in co-pending U.S. Appl. No. 15/229,197.
Office action dated Nov. 15, 2017 in co-pending U.S. Appl. No. 15/218,466.
Notice of allowance dated Nov. 15, 2018 in co-pending U.S. Appl. No. 15/229,203.
Notice of allowance dated Oct. 31, 2018 in co-pending U.S. Appl. No. 15/218,466.
Office action dated Nov. 2, 2018 in co-pending U.S. Appl. No. 15/229,197.
Notice of allowance dated Feb. 11, 2019 in co-pending U.S. Appl. No. 15/218,466.
Notice of allowance dated Feb. 19, 2019 in co-pending U.S. Appl. No. 15/229,194.
Notice of allowance dated Apr. 29, 2019 in co-pending U.S. Appl. No. 15/229,197.

* cited by examiner

CARRIER-ATTACHED COPPER FOIL, LAMINATE, LAMINATE PRODUCING METHOD, PRINTED WIRING BOARD PRODUCING METHOD, AND ELECTRONIC DEVICE PRODUCING METHOD

BACKGROUND OF THE INVENTION

1. Field of the Invention

The present invention relates to a carrier-attached copper foil, a laminate, a laminate producing method, a printed wiring board producing method, and an electronic device producing method.

2. Description of Related Art

A printed wiring board is typically produced through processes that involve bonding an insulating substrate to a copper foil to produce a copper-clad laminated board, and forming a conductor pattern by etching the copper foil surface. As miniaturization of electronic devices continues and the need for higher performance increases, there has been progress in the development of a high-density mounting technique for mounting components, and a technique for achieving high signal frequency. This has created new requirements for printed wiring boards, including fine (fine pitch) conductor patterns, or accommodation of high frequencies.

In order to meet the fine pitch requirement, a copper foil having a thickness of 9 μm or less, or a smaller thickness as thin as 5 μm or less is needed. Such ultrathin copper foils have poor mechanical strength, and easily break or produce wrinkles during production of a printed wiring board, and there has been an emergence of a carrier-attached copper foil that uses a thick metal foil as a carrier, and in which an ultrathin copper layer is electrodeposited on the carrier via a release layer. The ultrathin copper layer is laminated to an insulating substrate, and, after the thermocompression of these two layers, the carrier is released and removed via the release layer. Circuit patterns are formed on the exposed surface of the ultrathin copper layer using a resist, and a predetermined circuit is formed.

The resin bonding surface of the ultrathin copper layer in the carrier-attached copper foil mainly needs to have sufficient peel strength between the ultrathin copper layer and the resin base, and the peel strength needs to sufficiently remain even after treatments and processes, such as high-temperature heating, wet processes, soldering, and chemical treatments. In a typical method of improving the peel strength between the ultrathin copper layer and the resin base, large numbers of roughening particles are attached to the ultrathin copper layer after creating a large surface profile (irregularities, roughness) on the ultrathin copper layer.

However, a problem occurs when such an ultrathin copper layer having a large profile (irregularities, roughness) is used for a semiconductor package substrate, which requires a particularly fine circuit pattern compared to other printed wiring boards. Specifically, unwanted copper particles remain after etching the circuit, and this causes problems such as insulation failure between circuit patterns.

WO2004/005588 discloses a carrier-attached copper foil for fine circuits, including semiconductor package substrates. Specifically, this publication attempts to use a carrier-attached copper foil that is produced without roughening a surface of an ultrathin copper layer. Because of its low profile (irregularities, degree of roughness, roughness), the unroughened ultrathin copper layer tends to have poorer adhesion (peel strength) for resin than a common copper foil for printed wiring boards. This carrier-attached copper foil thus needs further improvements.

JP-A-2007-007937 and JP-A-2010-006071 describe providing a Ni layer and/or a Ni alloy layer, providing a chromate layer, providing a Cr layer and/or a Cr alloy layer, providing a Ni layer and a chromate layer, and providing a Ni layer and a Cr layer on the surface of a carrier-attached ultrathin copper foil that comes into contact with (or is bonded to) a polyimide resin substrate. By providing such surface treatment layers, these publications achieve the desired bonding strength between the polyimide resin substrate and the carrier-attached ultrathin copper foil, without a roughening treatment, or with a limited (finer) roughening treatment. These publications also describe performing a surface treatment with a silane coupling agent, or performing an antirust treatment.

The previous efforts to develop a carrier-attached copper foil had a primary focus on the peel strength between an ultrathin copper layer and a resin base. For this reason, there are not many studies concerning a carrier-attached copper foil suited for high-density mounting on a printed wiring board, and there is a room for further improvements.

The integrated circuit density of a printed wiring board is typically improved by forming a laser hole, and connecting the inner layer and the outer layer through the hole. A method that forms a fine circuit involving a fine pitch uses a technique called MSAP (Modified-Semi-Additive-Process), whereby an ultrathin copper layer is etched away with a sulfuric acid-hydrogen peroxide etchant after forming a wiring circuit on the ultrathin copper layer. Laser drillability through the ultrathin copper layer is therefore important in the fabrication of a high-density integrated circuit substrate. Laser drillability through the ultrathin copper layer is involved in a variety of conditions such as hole size accuracy, and laser output, and greatly affects the design and the productivity of an integrated circuit. Japanese Patent No. 3261119 describes a copper-clad laminated board having desirable laser drillability. However, studies by the present inventors found that further improvements are needed in terms of etchability.

SUMMARY OF THE INVENTION

It is accordingly an object of the present invention to provide a carrier-attached copper foil having desirable laser drillability through the ultrathin copper layer, and that is preferred for the fabrication of a high-density integrated circuit substrate.

The present inventors conducted extensive studies to achieve the foregoing object, and found that controlling the following factors is very effective for improving laser drillability through the ultrathin copper layer, the factors being the surface roughnesses of an ultrathin copper layer as measured with a laser microscope on the detached surface peeled off from a carrier-attached copper foil, the relationship between surface roughnesses, and the glossiness in MD direction after a predetermined heat treatment of the carrier-attached copper foil.

The present invention was completed on the basis of this finding, and an aspect of the invention is a carrier-attached copper foil including an interlayer and an ultrathin copper layer that are provided in this order on one or both surfaces of a carrier, wherein the surface roughness $Sz$ and the surface roughness $Sa$ on the interlayer side of the ultrathin copper layer satisfy $Sz \leq 3.6$ μm, and $Sz/Sa \leq 14.00$ as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours, and wherein GMD, which is a 60-degree glossiness of the ultrathin copper layer surface on the interlayer side in MD direction, satisfies GMD≤150 in case of detaching the carrier from the carrier-attached copper foil according to JIS C 6471 after the carrier-attached copper foil is laminated using the same procedure.

In an embodiment of the carrier-attached copper foil of the invention, the GMD, a 60-degree glossiness of the ultrathin copper layer surface on the interlayer side in MD direction, satisfies GMD≤80 in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In another embodiment of the carrier-attached copper foil of the invention, the GMD, a 60-degree glossiness of the ultrathin copper layer surface on the interlayer side in MD direction, satisfies GMD≤70 in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In yet another embodiment of the carrier-attached copper foil of the invention, the GMD, a 60-degree glossiness of the ultrathin copper layer surface on the interlayer side in MD direction, satisfies GMD≤65 in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In still another embodiment of the carrier-attached copper foil of the invention, the GMD, a 60-degree glossiness of the ultrathin copper layer surface on the interlayer side in MD direction, satisfies GMD≤5 in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In another embodiment of the carrier-attached copper foil of the invention, the surface roughness Sz and the surface roughness Sa on the interlayer side of the ultrathin copper layer satisfy Sz/Sa≤10.50 as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In yet another embodiment of the carrier-attached copper foil of the invention, the surface roughness Sz and the surface roughness Sa on the interlayer side of the ultrathin copper layer satisfy Sz/Sa≤9.50 as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In still another embodiment of the carrier-attached copper foil of the invention, the surface roughness Sz on the interlayer side of the ultrathin copper layer satisfies 0.01 m Sz as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In another embodiment of the carrier-attached copper foil of the invention, the surface roughness Sz and the surface roughness Sa on the interlayer side of the ultrathin copper layer satisfy 1.00≤Sz/Sa as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In yet another embodiment of the carrier-attached copper foil of the invention, the GMD, a 60-degree glossiness of the ultrathin copper layer surface on the interlayer side in MD direction, satisfies 0.01 GMD in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours.

In still another embodiment of the carrier-attached copper foil of the invention, the carrier-attached copper foil includes one or more layers selected from the group consisting of a roughening treatment layer, a heat-resistant layer, an antirust layer, a chromate treated layer, and a silane coupling process layer, the one or more layers being provided on at least one of the surfaces on the side of the ultrathin copper layer and on the side of the carrier when the carrier-attached copper foil of the embodiment of the invention has the ultrathin copper layer on one surface of the carrier, and the one or more layers being provided on one or both surfaces on the ultrathin copper layer side when the carrier-attached copper foil of the embodiment of the invention has the ultrathin copper layer on the both surfaces of the carrier.

In another embodiment of the carrier-attached copper foil of the invention, the carrier-attached copper foil includes a resin layer on the ultrathin copper layer.

In yet another embodiment of the carrier-attached copper foil of the invention, the carrier-attached copper foil includes a resin layer on the one or more layers selected from the group consisting of a roughening treatment layer, a heat-resistant layer, an antirust layer, a chromate treated layer, and a silane coupling process layer.

In another aspect of the invention, the present invention is a method for producing a laminate using the carrier-attached copper foil of the embodiment of the invention.

Another aspect of the invention is a laminate including the carrier-attached copper foil of the embodiment of the invention, and a resin, wherein the resin covers end surfaces of the carrier-attached copper foil either in part or as a whole.

Another aspect of the invention is a laminate including a first carrier-attached copper foil laminated from the carrier side or the ultrathin copper layer side to the carrier side or the ultrathin copper layer side of a second carrier-attached copper foil, the first and the second carrier-attached copper foils being the carrier-attached copper foil of the embodiment of the invention.

In an embodiment of the laminate of the invention, end surfaces of the laminate are covered with a resin either in part or as a whole.

Another aspect of the invention is a method for producing a printed wiring board, the method using a laminate produced by using the laminate producing method of the embodiment of the invention, or using the laminate of the embodiment of the invention.

Another aspect of the invention is a method for producing a printed wiring board, the method including:

providing a dual layer of resin and circuit at least once on a laminate produced by using the laminate producing method of the embodiment of the invention, or on the laminate of the embodiment of the invention; and detaching the ultrathin copper layer or the carrier from the carrier-attached copper foil of the laminate after the dual layer of resin and circuit is formed at least once.

Another aspect of the invention is a method for producing a printed wiring board using the carrier-attached copper foil of the embodiment of the invention.

Another aspect of the invention is a method for producing an electronic device using a printed wiring board produced by using the printed wiring board producing method of the embodiment of the invention.

Another aspect of the invention is a method for producing a printed wiring board, the method including:

preparing the carrier-attached copper foil of the embodiment of the invention, and an insulating substrate; laminating the carrier-attached copper foil and the insulating substrate to each other;

forming a copper-clad laminated board by detaching the carrier of the carrier-attached copper foil after the carrier-attached copper foil and the insulating substrate are laminated to each other; and forming a circuit by using any of a semi-additive process, a subtractive process, a partly additive process, and a modified semi-additive process.

Another aspect of the invention is a method for producing a printed wiring board, the method including:

forming a circuit on the surface of the carrier-attached copper foil of the embodiment of the invention on the side of the ultrathin copper layer or on the side of the carrier;

forming a resin layer on the ultrathin copper layer- or carrier-side surface of the carrier-attached copper foil so as to make the circuit embedded in the resin layer;

detaching the carrier or the ultrathin copper layer; and removing the ultrathin copper layer or the carrier after detaching the carrier or the ultrathin copper layer to expose the circuit formed on the ultrathin copper layer- or carrier-side surface and embedded in the resin layer.

Another aspect of the invention is a method for producing a printed wiring board, the method including:

laminating the surface of the carrier-attached copper foil of the embodiment of the invention to a resin substrate on the side of the ultrathin copper layer, or on the side of the carrier;

providing a dual layer of resin and circuit at least once on the ultrathin copper layer- or carrier-side surface of the carrier-attached copper foil opposite the surface laminated to the resin substrate; and detaching the carrier or the ultrathin copper layer from the carrier-attached copper foil after the formation of the dual layer of resin and circuit.

The present invention enables providing a carrier-attached copper foil having desirable laser drillability through the ultrathin copper layer, preferred for fabrication of a high-density integrated circuit substrate.

DESCRIPTION OF THE PREFERRED EMBODIMENTS

Carrier-Attached Copper Foil

Figure 1:
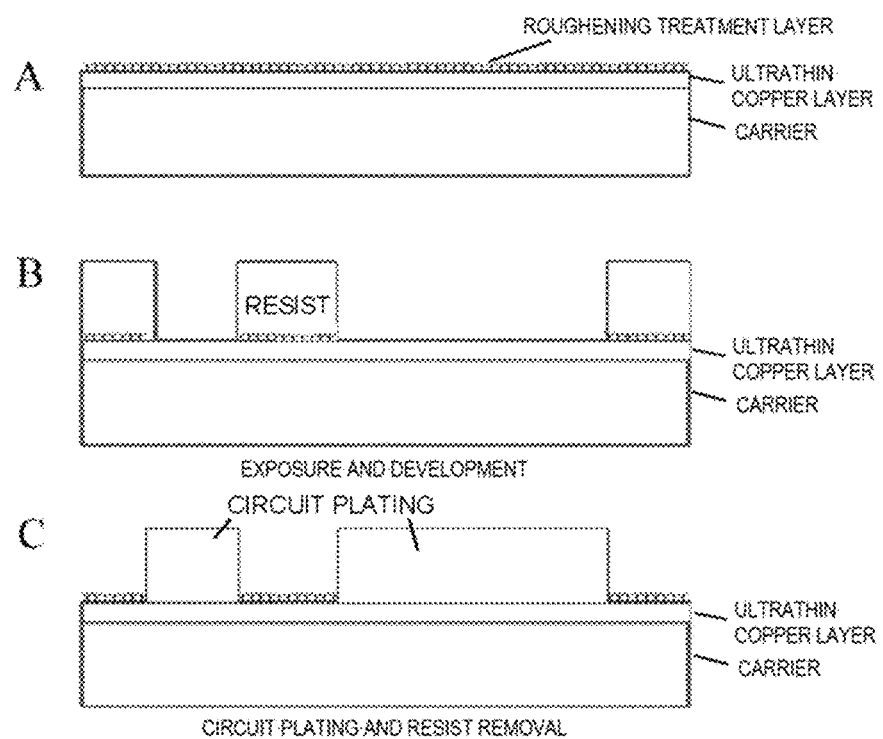
FIG. 1-A to 1-C are schematic views representing a wiring board cross section in processes from circuit plating to resist removal according to a specific example of a printed wiring board producing method using a carrier-attached copper foil of an embodiment of the present invention.

A carrier-attached copper foil of an embodiment of the present invention includes an interlayer, and an ultrathin copper layer, which are provided on one or both surfaces of a carrier, in this order. The carrier-attached copper foil itself may be used according to a known method. For example, a printed wiring board may be produced as follows. The surface of the ultrathin copper layer is laminated to an insulating substrate such as a paper base phenolic resin, a paper base epoxy resin, a synthetic fiber fabric base epoxy resin, a glass fabric-paper composite base epoxy resin, a glass fabric-glass nonwoven fabric composite base epoxy resin, a glass fabric base epoxy resin, a polyester film, and a polyimide film. After thermocompression, the carrier is detached, and the ultrathin copper layer bonded to the insulating substrate is etched into a desired conductor pattern.

The carrier-attached copper foil of the embodiment of the present invention is a carrier-attached copper foil in which the surface roughness Sz and the surface roughness Sa on the interlayer side of the ultrathin copper layer are controlled to satisfy Sz≤3.6 μm, and Sz/Sa≤14.00 as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm$^2$ and heated at 220° C. for 2 hours, and in which GMD, which is a 60-degree glossiness of the ultrathin copper layer surface on the interlayer side in MD direction, is controlled to satisfy GMD≤150 as measured in case of detaching the carrier from the carrier-attached copper foil according to JIS C 6471 after the carrier-attached copper foil is laminated using the same procedure. Heating at 220° C.

for 2 hours is a typical heating condition for the thermocompression of the carrier-attached copper foil laminated to an insulating substrate.

The carrier is detached after the thermocompression of the carrier-attached copper foil laminated to the insulating substrate, and the ultrathin copper layer bonded to the insulating substrate is etched into a desired conductor pattern to form a circuit. A printed wiring board is fabricated after providing a multilayer structure for a substrate in the manner described above. In order to increase the density of the integrated circuit on the printed wiring board, a laser hole is formed, and the inner layer and the outer layer are connected through the hole. Any difficulty in providing a laser hole through the ultrathin copper layer is obviously a problem, and the laser hole needs to have an appropriate size because a laser hole that is too large or too small causes various problems. The laser drillability through the ultrathin copper layer is involved in a range of conditions, including hole size accuracy, and laser output, and represents an important quality that greatly affects the design and the productivity of the integrated circuit. The present invention found that the ultrathin copper layer can have desirable laser drillability when the surface roughness Sz and the surface roughness Sa on the interlayer side of the ultrathin copper layer are controlled to satisfy Sz≤3.6 µm, and Sz/Sa≤14.00 as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours, and that GMD, which is a 60-degree glossiness of the ultrathin copper layer surface on the interlayer side in MD direction, is controlled to satisfy GMD≤150 as measured in case of detaching the carrier from the carrier-attached copper foil according to JIS C 6471 after the carrier-attached copper foil is laminated using the same procedure. When the surface roughness Sz on the interlayer side of the ultrathin copper layer as measured with a laser microscope exceeds 3.6 µm, the ultrathin copper layer surface becomes too rough, and the laser used to drill a hole becomes absorbed in excess, and makes a hole of an excessive size. When the Sz/Sa ratio of surface roughness Sz and surface roughness Sa exceeds 14.00, there will be locations with large surface roughness (irregularities), and this causes defective M-SAP circuit formation. When the 60-degree glossiness GMD in MD direction exceeds 150, the laser reflectance increases while drilling a hole, and drillability suffers.

The surface roughness Sz on the interlayer side of the ultrathin copper layer as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours is preferably 3.5 µm or less, more preferably 3.4 µm or less. The lower limit of the surface roughness Sz may be 0.01 µm or more, 0.1 µm or more, 0.2 µm or more, 0.3 µm or more, or 0.4 µm or more.

The Sz/Sa ratio of the surface roughness Sz and the surface roughness Sa on the interlayer side of the ultrathin copper layer as measured with a laser microscope in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours is preferably 13.50 or less, more preferably 13.00 or less, further preferably 12.50 or less, even more preferably 12.00 or less, further preferably 11.50 or less, yet more preferably 11.00 or less, even more preferably 10.50 or less, further preferably 10.00 or less, yet more preferably 9.50 or less. The lower limit of the Sz/Sa ratio may be 1.00 or more, 1.50 or more, 2.00 or more, 2.50 or more, or 3.00 or more.

The 60-degree glossiness GMD in MD direction on the interlayer side of the ultrathin copper layer in case of detaching the carrier from the carrier-attached copper foil according to JIS C 6471 after the carrier-attached copper foil is laminated to an insulating substrate from the ultrathin copper layer side under a pressure of 20 kgf/cm² and heated at 220° C. for 2 hours is preferably 140 or less, more preferably 130 or less, further preferably 120 or less, even more preferably 100 or less, further preferably 90 or less, yet more preferably 80 or less, further preferably 70 or less, even more preferably 65 or less, further preferably 60 or less, yet more preferably 55 or less, further preferably 45 or less, even more preferably 35 or less, further preferably 25 or less, more preferably 15 or less, further preferably 5 or less. The lower limit of the 60-degree glossiness GMD in MD direction may be 0 or more, 0.01 or more, 0.05 or more, 0.1 or more, or 0.5 or more.

Carrier

The carrier that is usable in the present invention is typically a metal foil or a resin film, and is provided in the form of, for example, a copper foil, a copper alloy foil, a nickel foil, a nickel alloy foil, an iron foil, an iron alloy foil, a stainless steel foil, an aluminum foil, an aluminum alloy foil, an insulating resin film, a polyimide film, an LCP (liquid crystal polymer) film, a fluororesin film, a polyamide film, and a PET film.

The carrier that is usable in the present invention is typically provided in the form of a press-rolled copper foil, or an electrolytic copper foil. Typically, an electrolytic copper foil is produced by electrolytic deposition of copper on a titanium or stainless steel drum from a copper sulfate plating bath. A press-rolled copper foil is typically produced by repeating plastic working by pressure rolls, and a heat treatment. The copper foil material may be a high-purity copper material, for example, such as tough pitch copper (JIS H3100 alloy No. C1100), and oxygen-free copper (JIS H3100 alloy No. C1020, or JIS H3510 alloy No. C1011). The copper foil material also may be a copper alloy material, for example, such as Sn-containing copper, Ag-containing copper, a copper alloy containing elements such as Cr, Zr, and Mg, and a Corson copper alloy containing Ni and Si. As used herein, the term "copper foil", when used by itself, is inclusive of "copper alloy foil."

The thickness of the carrier usable in the present invention is not particularly limited either, and the carrier may have any thickness, for example, 5 µm or more, as long as it is appropriately adjusted to a thickness suited as a carrier. However, typically, the carrier thickness is preferably 35 µm or less because the production cost increases when it is too thick. Taken together, the carrier thickness is typically 8 to 70 µm, more typically 12 to 70 µm, further typically 18 to 35 µm. From the standpoint of reducing the raw material cost, it is preferable to make the carrier as thin as possible. For these reasons, the carrier thickness is typically 5 µm to 35 m, preferably 5 µm to 18 µm, preferably 5 µm to 12 µm, preferably 5 µm to 11 µm, preferably 5 µm to 10 µm. When the carrier is thin, a crease tends to generate while the carrier passes through machinery for processing. Crease generation can be effectively prevented by, for example, smoothing the conveyer roll of a carrier-attached copper foil manufacturing apparatus, or making the distance between the adjacent conveyer rolls shorter. The carrier needs to have high rigidity when the carrier-attached copper foil is used in an embedded process, a technique used in a printed wiring board producing method. When using an embedded process, it is therefore preferable that the carrier thickness be 18 μm to 300 μm, 25 μm to 150 μm, 35 μm to 100 μm, more preferably 35 μm to 70 μm.

A roughening treatment layer may be provided on the carrier surface opposite the surface provided with the ultrathin copper layer. The roughening treatment layer may be provided by using a known method, or by performing the roughening treatment described below. It is advantageous to provide the roughening treatment layer on the carrier surface opposite the surface provided with the ultrathin copper layer because it makes the carrier less likely to detach itself from a resin substrate when the carrier is laminated to a support such as a resin substrate on the side having the roughening treatment layer.

In the present invention, the surface roughness Sz on the interlayer side of the ultrathin copper layer measured with a laser microscope, the relationship between surface roughness Sz and surface roughness Sa, and the 60-degree glossiness in MD direction may be controlled by adjusting the surface form of the carrier on the ultrathin copper layer side. The following describes a carrier fabrication method of an embodiment of the present invention.

List below are examples of the producing conditions when an electrolytic copper foil is used as the carrier.

The Sz/Sa value tends to decrease when the chlorine concentration in an electrolytic solution is high, the linear velocity of an electrolytic solution is high, the electrolytic solution temperature is low, the copper concentration in an electrolytic solution is high, or the sulfuric acid concentration in an electrolytic solution is low. On the other hand, the Sz/Sa value tends to increase when the chlorine concentration in an electrolytic solution is low, the linear velocity of an electrolytic solution is low, the electrolytic solution temperature is high, the copper concentration in an electrolytic solution is low, or the sulfuric acid concentration in an electrolytic solution is high.

Electrolytic Solution Composition

Copper: 70 to 150 g/L

Sulfuric acid: 80 to 120 g/L

Chlorine: 10 to 200 ppm

Producing Conditions

Current density: 50 to 150 A/dm$^2$

Electrolytic solution temperature: 40 to 80° C.

Linear velocity of electrolytic solution: 3 to 7 m/sec

Electrolysis time: 0.5 to 10 min

A gloss agent may be added to the electrolytic solution, provided that the amount is small. The following compounds, and known compounds may be used as gloss agents.

Leveling agent 1 (bis(3-sulfopropyl)disulfide): 0.5 to 3 ppm

Leveling agent 2 (amine compound): 0.5 to 3 ppm

The amine compound may be an amine compound of the following chemical formula.

The remainder of the process solution used for processes such as electrolysis, surface treatment, and plating in the present invention is water, unless otherwise stated.

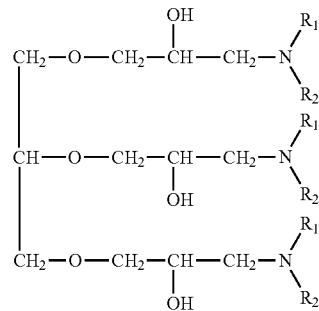

(In the chemical formula, $R_1$ and $R_2$ are selected from the group consisting of a hydroxyalkyl group, an ether group, an aryl group, an aromatic substituted alkyl group, an unsaturated hydrocarbon group, and an alkyl group.)

The method (1) or (2) below may be used to adjust the surface form of the carrier on the ultrathin copper layer side. The surface form of the carrier on the ultrathin copper layer side becomes similar to the surface form of the ultrathin copper layer on the carrier side. A carrier-attached ultrathin copper foil with an ultrathin copper layer having a desired surface form on the carrier side can thus be obtained by adjusting the surface form of the carrier on the ultrathin copper layer side.

(1) A carrier having predetermined Sz and Sa values is subjected to soft etching using an etchant containing a triazole-based organic compound (triazole compound). The triazole-based organic compound is adsorbed in greater amounts in predetermined portions of the carrier than in other portions. The carrier surface shape is controlled by taking advantage of the property that portions that have adsorbed larger amounts of triazole-based organic compound are less likely to be etched than in portions where the triazole-based organic compound was absorbed in smaller amounts. The concentration of the triazole-based organic compound in the process solution used for soft etching is preferably 0.5 to 10 g/L. The effect to control the carrier surface shape becomes smaller when the concentration of the triazole-based organic compound is less than 0.5 g/L. On the other hand, the soft etching rate of the carrier surface may decrease at concentrations above 10 g/L. A carrier-attached ultrathin copper foil with an ultrathin copper layer having a desired surface form on the carrier side can be obtained by controlling the carrier surface shape.

Specifically, a carrier having a surface roughness Sz of 0.8 μm to 3.1 μm, a surface roughness Sa of 0.05 to 0.45 μm, and a 60-degree specular glossiness of 30 to 250(%) is subjected to soft etching (for example, etching at 25 to 35° C. for 5 to 60 seconds in an aqueous solution containing 20 to 100 g/L of sulfuric acid, 10 to 20 g/L of hydrogen peroxide, 10 to 50 g/L of potassiumpersulfate, or 10 to 50 g/L of ammonium persulfate, and 1 to 5 g/L of the additive component triazole-based organic compound).

The triazole-based organic compound may be at least one selected from the group consisting of 1,2,3-benzotriazole, carboxybenzotriazole, N',N'-bis(benzotriazolylmethyl)urea, 1H-1,2,4-triazole, and 3-amino-1H-1,2,4-triazole.

(2) A carrier is produced by performing rolling under the conditions that involve a larger than normal oil film equivalent, using pressure rolls that have been controlled to have a surface arithmetic mean roughness Ra in a predetermined range.

Specifically, a metal foil such as a press-rolled copper foil is prepared as a carrier, and finishing cold rolling is performed on the press-rolled copper foil or other such metal foils, using pressure rolls that have been controlled to have a surface arithmetic mean roughness Ra in a predetermined range. Here, a pressure roll surface may have an arithmetic mean roughness Ra of 0.2 to 0.3 μm according to JIS B0601 1994, and the oil film equivalent may be 41,000 to 65,000.

The oil film equivalent is represented by the following formula.

Oil film equivalent={(rolling oil viscosity [cSt])× (line speed [mpm]+roll circumferential velocity [mpm])}/{(roll bite angle [rad])×(yield stress of material[kg/mm$^2$])}

The rolling oil viscosity [cSt] is the kinetic viscosity at 40° C.

Known methods may be used to achieve an oil film equivalent of 41,000 to 65,000, for example, by using a high-viscosity rolling oil, or by increasing the line speed of the metal foil.

Interlayer

The interlayer is provided on one or both surfaces of the carrier. Another layer or Other layers may be provided between the carrier and the interlayer. The interlayer used in the present invention is not particularly limited, as long as it has a configuration that does not easily allow the ultrathin copper layer to be detached from the carrier before the lamination of the carrier-attached copper foil to the insulating substrate, but allows the ultrathin copper layer to be detached from the carrier after the lamination to the insulating substrate. For example, the interlayer of the carrier-attached copper foil of the embodiment of the present invention may contain one or more selected from the group consisting of Cr, Ni, Co, Fe, Mo, Ti, W, P, Cu, Al, Zn, alloys thereof, hydrates thereof, oxides thereof, and organic materials. More than one interlayer may be provided.

The interlayer may be formed by, for example, forming the following layers from the carrier side:
a simple metal layer of one element selected from the element group including Cr, Ni, Co, Fe, Mo, Ti, W, P, Cu, Al, and Zn;
an alloy layer of one or more elements selected from the element group including Cr, Ni, Co, Fe, Mo, Ti, W, P, Cu, Al, and Zn; or
an organic material layer, and one of the following layers formed thereon: a hydrate or oxide layer of one or more elements selected from the element group including Cr, Ni, Co, Fe, Mo, Ti, W, P, Cu, Al, and Zn; a simple metal layer of one element selected from the element group including Cr, Ni, Co, Fe, Mo, Ti, W, P, Cu, Al, and Zn; and an alloy layer of one or more elements selected from the element group including Cr, Ni, Co, Fe, Mo, Ti, W, P, Cu, Al, and Zn.

When the interlayer is provided only on one surface of the carrier, it is preferable to provide an antirust layer, such as a Ni plated layer, on the other surface of the carrier. When the interlayer is provided by a chromate treatment, a zinc chromate treatment, or plating, it is believed that some of the adhering metals, including chromium and zinc, would form hydrates or oxides.

The interlayer also may be formed by, for example, laminating nickel, a nickel-phosphorus alloy or a nickel-cobalt alloy, and chromium, in this order, on the carrier. Because the adhesion between nickel and copper is stronger than the adhesion between chromium and copper, the ultrathin copper layer can detach itself at the interface with the chromium when being detached. The nickel in the interlayer is also expected to provide a barrier effect that prevents the diffusion of the copper component from the carrier into the ultrathin copper layer. The deposit amount of the nickel in the interlayer is preferably 100 μg/dm$^2$ to 40,000 μg/dm$^2$, more preferably 100 μg/dm$^2$ to 4,000 μg/dm$^2$, more preferably 100 μg/dm$^2$ to 2,500 μg/dm$^2$, more preferably 100 μg/dm$^2$ or more and less than 1,000 μg/dm$^2$. The deposit amount of the chromium in the interlayer is preferably 5 μg/dm$^2$ to 100 μg/dm$^2$. When the interlayer is provided only on one surface of the carrier, it is preferable to provide an antirust layer, such as a Ni plated layer, on the other surface.

The organic material contained in the interlayer is preferably at least one organic material selected from the group consisting of nitrogen-containing organic compounds, sulfur-containing organic compounds, and carboxylic acids. Specifically, preferred as the nitrogen-containing organic compounds are triazole compounds having a substituent, including, for example, 1,2,3-benzotriazole, carboxybenzotriazole, N',N'-bis(benzotriazolylmethyl)urea, 1H-1,2,4-triazole, and 3-amino-1H-1,2,4-triazole.

Preferred as the sulfur-containing organic compounds are mercaptobenzothiazole, sodium 2-mercaptobenzothiazole, thiocyanuric acid, and 2-benzimidazolethiol.

Preferred as the carboxylic acids are monocarboxylic acids, particularly oleic acid, linoleic acid, and linolenic acid.

Ultrathin Copper Layer

The ultrathin copper layer is provided on the interlayer. Another layer or Other layers may be provided between the interlayer and the ultrathin copper layer. The ultrathin copper layer may be formed by electroplating of materials such as copper sulfate, copper pyrophosphate, copper sulfamate, and copper cyanide, using an electrolytic bath. Use of a copper sulfate bath is preferred because it is commonly used for electrolytic copper foils, and enables forming a copper foil at high current density. The thickness of the ultrathin copper layer is not particularly limited, and is typically thinner than the carrier, for example, 12 μm or less. Typically, the thickness of the ultrathin copper layer is 0.5 to 12 μm, more typically 1 to 5 μm, further typically 1.5 to 5 μm, further typically 2 to 5 μm. The ultrathin copper layer may be provided on the both surfaces of the carrier.

The carrier-attached copper foil of the present invention may be used to fabricate a laminate (e.g., a copper-clad laminated board). Such a laminate may have an ordered configuration of, for example, "ultrathin copper layer/interlayer/carrier/resin or prepreg", "carrier/interlayer/ultrathin copper layer/resin or prepreg", "ultrathin copper layer/interlayer/carrier/resin or prepreg/carrier/interlayer/ultrathin copper layer", or "carrier/interlayer/ultrathin copper layer/resin or prepreg/ultrathin copper layer/interlayer/carrier". The resin or prepreg may be a resin layer (described later), and may contain materials such as resins, resin curing agents, compounds, curing promoting agents, dielectrics, reaction catalysts, crosslinking agents, polymers, prepregs, and skeleton materials used for the resin layer described below. The carrier-attached copper foil may be smaller than the resin or prepreg as viewed in a planar view.

Roughening Treatment, and Other Surface Treatments

The surface of the ultrathin copper layer, and/or the surface of the carrier may be subjected to a roughening treatment to provide a roughening treatment layer, for example, for purposes such as providing desirable adhesion for the insulating substrate. The roughening treatment may be performed by, for example, forming roughening particles with copper or a copper alloy. The roughening treatment may be a fine roughening treatment. The roughening treatment layer may be a layer of a simple substance selected from the group consisting of copper, nickel, phosphorous, tungsten, arsenic, molybdenum, chromium, iron, vanadium, cobalt, and zinc, or a layer of an alloy containing one or more of these simple substances. After the formation of roughening particles with copper or a copper alloy, a further roughening treatment may be performed to provide secondary or tertiary particles with a simple substance, specifically, nickel, cobalt, copper, or zinc, or with an alloy thereof. This may be followed by formation of a heat-resistant layer or an antirust layer with a simple substance, specifically, nickel, cobalt, copper, or zinc, or with an alloy thereof, and the surface may be further treated with processes such as a chromate treatment, and a silane coupling process. Alternatively, without a roughening treatment, a heat-resistant layer or an antirust layer of a simple substance, specifically, nickel, cobalt, copper, or zinc, or an alloy thereof, may be formed, and the surface may be further treated with processes such as a chromate treatment, and a silane coupling process. Specifically, one or more layers selected from the group consisting of a heat-resistant layer, an antirust layer, a chromate treated layer, and a silane coupling process layer may be formed on the surface of the roughening treatment layer, and one or more layers selected from the group consisting of a heat-resistant layer, an antirust layer, a chromate treated layer, and a silane coupling process layer may be formed on the surface of the ultrathin copper layer, or on the carrier surface. The heat-resistant layer, the antirust layer, the chromate treated layer, and the silane coupling process layer may each be provided as a plurality of layers (for example, 2 or more layers, 3 or more layers).

For example, copper-cobalt-nickel alloy plating as a roughening treatment may be performed so as to form a ternary alloy layer by electrolytic plating with deposit amounts of 15 to 40 mg/dm$^2$ copper, 100 to 3,000 µg/dm$^2$ cobalt, and 100 to 1,500 µg/dm$^2$ nickel. Heat resistance may suffer, and poor etchability may result when the Co deposit amount is less than 100 µg/dm$^2$. A Co deposit amount of above 3,000 µg/dm$^2$ is not preferable when the effect of magnetism needs to be taken into consideration, and an etching smear may occur, and acid resistance and chemical resistance may suffer in such a range. Heat resistance may suffer when the Ni deposit amount is less than 100 µg/dm$^2$. On the other hand, the etching residue may increase when the Ni deposit amount exceeds 1,500 µg/dm$^2$. The preferred Co deposit amount is 1,000 to 2,500 µg/dm$^2$, and the preferred nickel deposit amount is 500 to 1,200 µg/dm$^2$. As used herein, "etching smear" means remaining of undissolved cobalt after the etching with copper chloride, and "etching residue" means remaining of undissolved nickel after alkali etching with ammonium chloride.

The following is an example of the typical bath, and the typical plating conditions used to form a ternary copper-cobalt-nickel alloy plating:

Plating bath composition: Cu 10 to 20 g/L, Co 1 to 10 g/L, Ni 1 to 10 g/L
 pH: 1 to 4
 Temperature: 30 to 50° C.
 Current density $D_k$: 20 to 30 A/dm$^2$
 Plating time: 1 to 5 s The heat-resistant layer, and the antirust layer may be a known heat-resistant layer or a known antirust layer. For example, the heat-resistant layer and/or the antirust layer may be a layer containing one or more elements selected from the group consisting of nickel, zinc, tin, cobalt, molybdenum, copper, tungsten, phosphorus, arsenic, chromium, vanadium, titanium, aluminum, gold, silver, platinum series elements, iron, and tantalum, or may be a metal layer or an alloy layer of one or more elements selected from the group consisting of nickel, zinc, tin, cobalt, molybdenum, copper, tungsten, phosphorus, arsenic, chromium, vanadium, titanium, aluminum, gold, silver, platinum series elements, iron, and tantalum. The heat-resistant layer, and/or the antirust layer may contain oxides, nitrides, or silicides containing the foregoing elements. The heat-resistant layer, and/or antirust layer may be a layer containing a nickel-zinc alloy. The heat-resistant layer, and/or antirust layer may be a nickel-zinc alloy layer. The nickel-zinc alloy layer may contain 50 wt % to 99 wt % of nickel, and 50 wt % to 1 wt % of zinc, excluding unavoidable impurities. The total deposit amount of zinc and nickel in the nickel-zinc alloy layer may be 5 to 1,000 mg/m$^2$, preferably 10 to 500 mg/m$^2$, preferably 20 to 100 mg/m$^2$. The deposit amount ratio of nickel and zinc in the nickel-zinc alloy-containing layer or in the nickel-zinc alloy layer (=nickel deposit amount/zinc deposit amount) is preferably 1.5 to 10. The deposit amount of nickel in the nickel-zinc alloy-containing layer or in the nickel-zinc alloy layer is preferably 0.5 mg/m$^2$ to 500 mg/m$^2$, more preferably 1 mg/m$^2$ to 50 mg/m$^2$. The adhesion between the copper foil and the resin substrate improves when the heat-resistant layer and/or the antirust layer is a layer containing a nickel-zinc alloy.

For example, the heat-resistant layer and/or the antirust layer may be an ordered laminate of a nickel or a nickel alloy layer having an deposit amount of 1 mg/m$^2$ to 100 mg/m$^2$, preferably 5 mg/m$^2$ to 50 mg/m$^2$, and a tin layer having a deposit amount of 1 mg/m$^2$ to 80 mg/m$^2$, preferably 5 mg/m$^2$ to 40 mg/m$^2$, and the nickel alloy layer may be configured from any of a nickel-molybdenum alloy, a nickel-zinc alloy, a nickel-molybdenum-cobalt alloy, and a nickel-tin alloy. The heat-resistant layer and/or the antirust layer preferably has a [nickel deposit amount in nickel or nickel alloy]/[tin deposit amount] ratio of 0.25 to 10, more preferably 0.33 to 3. With such a heat-resistant layer and/or an antirust layer, the peel strength of the circuit, and the degradation rate of peel strength against chemicals become desirable after the carrier-attached copper foil is processed into a printed wiring board.

The chromate treated layer is a layer formed after a treatment with a solution containing a chromic anhydride, chromic acid, dichromic acid, chromate, or dichromate. The chromate treated layer may contain elements such as cobalt, iron, nickel, molybdenum, zinc, tantalum, copper, aluminum, phosphorus, tungsten, tin, arsenic, and titanium (may be contained in any form, including metals, alloys, oxides, nitrides, and sulfides). Specific examples of the chromate treated layer include a chromate treated layer treated with an aqueous solution of chromic anhydride or potassium dichromate, and a chromate treated layer treated with a process solution containing chromic anhydride or potassium dichromate, and zinc.

The silane coupling process layer may be formed by using a known silane coupling agent, or by using a silane coupling agent such as epoxy-based silane, amino-based silane, methacryloxy-based silane, mercapto-based silane, vinyl-based silane, imidazole-based silane, and triazine-based silane. Such silane coupling agents may be used as a mixture of two or more. Preferably, the silane coupling process layer is a layer formed by using an amino-based silane coupling agent, or an epoxy-based silane coupling agent.

Preferably, the silane coupling process layer is provided in 0.05 mg/m$^2$ to 200 mg/m$^2$, preferably 0.15 mg/m$^2$ to 20 mg/m$^2$, preferably 0.3 mg/m$^2$ to 2.0 mg/m$^2$ in terms of a silicon atom. The adhesion between the base and the surface-treated copper foil can further improve when the silane coupling process layer is provided in these ranges.

The surface of the ultrathin copper layer, the roughening treatment layer, the heat-resistant layer, the antirust layer, the silane coupling process layer, or the chromate treated layer may be subjected to the surface treatments described in WO2008/053878, JP-A-2008-111169, Japanese Patent No. 5024930, WO2006/028207, Japanese Patent No. 4828427, WO2006/134868, Japanese Patent No. 5046927, WO2007/105635, Japanese Patent No. 5180815, and JP-A-2013-19056.

The carrier-attached copper foil including the carrier, the interlayer laminated on the carrier, and the ultrathin copper layer laminated on the interlayer may include a roughening treatment layer on the ultrathin copper layer, and one or more layers selected from the group consisting of a heat-resistant layer, an antirust layer, a chromate treated layer, and a silane coupling process layer may be provided on the roughening treatment layer.

A roughening treatment layer may be provided on the ultrathin copper layer. A heat-resistant layer and an antirust layer may be provided on the roughening treatment layer. A chromate treated layer may be provided on the heat-resistant layer and the antirust layer. A silane coupling process layer may be provided on the chromate treated layer.

The carrier-attached copper foil may include a resin layer on the ultrathin copper layer, on the roughening treatment layer, on the heat-resistant layer and the antirust layer, on the chromate treated layer, or on the silane coupling process layer. The resin layer may be an insulating resin layer.

The resin layer may be an adhesive, or a partially cured (B stage) insulating resin layer for bonding. Here, "partially cured state (B stage)" refers to a state in which the surface does not feel tacky when touched with a finger, and allows the insulating resin layers to be stored as a laminate, and in which a cure reaction occurs upon a further heat treatment.

The resin layer may contain a thermosetting resin, or may be a thermoplastic resin. The resin layer may contain a thermoplastic resin. The resin is not particularly limited. Preferred examples of the resin include resins containing one or more selected from the group consisting of epoxy resins, polyimide resins, polyfunctional cyanate ester compounds, maleimide compounds, polyvinyl acetal resins, urethane resins, polyethersulfone, polyethersulfone resins, aromatic polyamide resins, polyamideimide resins, rubber-modified epoxy resins, phenoxy resins, carboxyl group-modified acrylonitrile-butadiene resins, polyphenylene oxide, bismaleimidetriazine resins, thermosetting polyphenylene oxide resins, cyanate ester-based resins, anhydrides of polyvalent carboxylic acids, linear polymers having a crosslinkable functional group, polyphenylene ether resins, 2,2-bis(4-cyanatephenyl)propane, phosphorus-containing phenol compounds, manganese naphthenate, 2,2-bis(4-glycidylphenyl)propane, polyphenylene ether-cyanate-based resins, siloxane-modified polyamideimide resins, cyano ester resins, phosphazene-based resins, rubber-modified polyamideimide resins, isoprene, hydrogenated polybutadiene, polyvinyl butyral, phenoxys, high-molecular epoxys, aromatic polyamides, fluororesin, bisphenols, block copolymerized polyimide resins, and cyano ester resins.

Use of the epoxy resin does not pose any problem, provided that it contains two or more epoxy groups within the molecule, and can be used in electrical and electronic material applications. The epoxy resin is preferably an epoxy resin that has been epoxylated with a compound having two or more glycidyl groups within the molecule. The epoxy resin may be one or a mixture of two or more selected from the group consisting of bisphenol A-type epoxy resins, bisphenol F-type epoxy resins, bisphenol S-type epoxy resins, bisphenol AD-type epoxy resins, novolac-type epoxy resins, cresol novolac-type epoxy resins, alicyclic epoxy resins, brominated epoxy resins, phenol novolac-type epoxy resins, naphthalene-type epoxy resins, brominated bisphenol A-type epoxy resins, ortho-cresol novolac-type epoxy resins, rubber-modified bisphenol A-type epoxy resins, glycidylamine-type epoxy resins, glycidylamine compounds (such as triglycidyl isocyanurate, and N,N-diglycidyl aniline), glycidyl ester compounds (such as a tetrahydrophthalic acid diglycidyl ester), phosphorus-containing epoxy resins, biphenyl-type epoxy resins, biphenyl novolac-type epoxy resins, tris-hydroxyphenyl methane-type epoxy resins, and tetraphenylethane-type epoxy resins. The epoxy resin also may be a hydrogenated or halogenated form of these epoxy resins.

The phosphorus-containing epoxy resins may be known epoxy resins containing phosphorus. Preferably, the phosphorus-containing epoxy resins are, for example, epoxy resins obtained as derivatives of 9,10-dihydro-9-oxa-10-phosphaphenanthrene-10-oxide having two or more epoxy groups within the molecule.

The resin layer may contain known materials, including resins, resin curing agents, compounds, curing promoting agents, dielectrics (may be any dielectrics, including dielectrics containing an inorganic compound and/or an organic compound, and dielectrics containing a metal oxide), reaction catalysts, crosslinking agents, polymers, prepregs, skeleton materials, and the resins and the compounds exemplified above. The resin layer may be formed by using the substances (including resins, resin curing agents, compounds, curing promoting agents, dielectrics, reaction catalysts, crosslinking agents, polymers, prepregs, and skeleton materials), and/or the resin layer forming methods and apparatuses described in, for example, WO2008/004399, WO2008/053878, WO2009/084533, JP-A-11-5828, JP-A-11-140281, Japanese Patent No. 3184485, WO97/02728, Japanese Patent No. 3676375, JP-A-2000-43188, Japanese Patent No. 3612594, JP-A-2002-179772, JP-A-2002-359444, JP-A-2003-304068, Japanese Patent No. 3992225, JP-A-2003-249739, Japanese Patent No. 4136509, JP-A-2004-82687, Japanese Patent No. 4025177, JP-A-2004-349654, Japanese Patent No. 4286060, JP-A-2005-262506, Japanese Patent No. 4570070, JP-A-2005-53218, Japanese Patent No. 3949676, Japanese Patent No. 4178415, WO2004/005588, JP-A-2006-257153, JP-A-2007-326923, JP-A-2008-111169, Japanese Patent No. 5024930, WO2006/028207, Japanese Patent No. 4828427, JP-A-2009-67029, WO2006/134868, Japanese Patent No. 5046927, JP-A-2009-173017, WO2007/105635, Japanese Patent No. 5180815, WO2008/114858, WO2009/008471, JP-A-2011-14727, WO2009/001850, WO2009/145179, WO2011/068157, and JP-A-2013-19056.

Resin Layer Containing Dielectric (Dielectric Filler)

The resin layer may contain a dielectric (a dielectric filler).

When a dielectric (a dielectric filler) is incorporated in any of the resin layers above or in the resin composition, it is possible to form a capacitor layer, and increase the capacitance of a capacitor circuit. A dielectric powder of composite oxides having a perovskite structure, such as $BaTiO_3$, $SrTiO_3$, $Pb(Zr-Ti)O_3$ (common name: PZT), $PbLaTiO_3.PbLaZrO$ (common name: PLZT), $SrBi_2Ta_2O_9$ (common name: SBT) is used as the dielectric (dielectric filler).

The resin, and/or the resin composition, and/or the compound contained in the resin layer are dissolved in a solvent, for example, such as methyl ethyl ketone (MEK), and toluene to prepare a resin solution. The resin solution is applied to the ultrathin copper layer, or to the heat-resistant layer or the antirust layer, the chromate coating layer, or the silane coupling agent layer by using a technique, for example, such as roll coating, and, as required, heated to dry and remove the solvent and produce the B-stage state. The solution may be dried using, for example, a hot-air drying furnace. The drying temperature may be 100 to 250° C., preferably 130 to 200° C.

In an aspect of the invention, the carrier-attached copper foil with the resin layer (resin- and carrier-attached copper foil) is used after the following procedure. The carrier-attached copper foil with the resin layer is mated with a base on the resin layer side, and the whole is thermocompressed to heat cure the resin layer. The carrier is then detached to expose the ultrathin copper layer (evidently, the surface exposed is the interlayer side of the ultrathin copper layer). A predetermined wiring pattern is then formed on the exposed surface.

With the resin- and carrier-attached copper foil, the number of prepregs used for the production of a laminated printed circuit board can be reduced. The resin- and carrier-attached copper foil also enables producing a copper-clad laminated board without providing the resin layer in a thickness that ensures insulation between layers, or without using a prepreg material at all. The surface smoothness can be further improved by undercoating an insulating resin on the base surface.

The lack of need to use a prepreg material is also advantageous from the economical standpoint because it can save the material cost of prepreg material, and simplifies the lamination process. Another advantage is that the laminated printed circuit board can be made thinner by the amount that would otherwise be occupied by the prepreg material thickness, making it possible to produce an ultrathin laminated printed circuit board with a single-layer thickness of 100 μm or less.

The thickness of the resin layer is preferably 0.1 to 80 μm. When the resin layer thickness is below 0.1 μm, the adhesion suffers, and it may become difficult to ensure interlayer insulation from the circuit of an inner layer material when a prepreg material is not interposed in laminating the resin- and carrier-attached copper foil to a base provided with an inner layer material.

On the other hand, it is economically disadvantageous to make the resin layer thicker than 80 μm because it makes it difficult to form a resin layer of the intended thickness in a single coating step, and increases the material cost and the man-hour. Further, because such a resin layer involves poor flexibility, cracking tends to occur during handling, and smooth lamination may be impeded by the excess resin flow generated during the thermocompression with the inner layer material.

As another product form of the resin- and carrier-attached copper foil, the resin layer may be coated over the ultrathin copper layer, or over the heat-resistant layer or the antirust layer, the chromate treated layer, or the silane coupling process layer. After creating a partially cured state, the carrier may be detached to produce a resin-attached copper foil that lacks the carrier.

A printed circuit board is completed upon mounting electronic components on the printed wiring board. As used herein, "printed wiring board" is inclusive of a printed wiring board, printed circuit board, and printed board populated with electronic components, as above.

The printed wiring board may be used to fabricate an electronic device. The printed circuit board populated with electronic components may be used to fabricate an electronic device. The printed board populated with electronic components may be used to fabricate an electronic device. Examples of the printed wiring board manufacturing process using the carrier-attached copper foil according to the present invention are given below.

An embodiment of the printed wiring board producing method according to the present invention includes:

preparing a carrier-attached copper foil according to the present invention, and an insulating substrate;

laminating the carrier-attached copper foil and the insulating substrate to each other;

forming a copper-clad laminated board by detaching the carrier of the carrier-attached copper foil after the carrier-attached copper foil and the insulating substrate are laminated to each other with the ultrathin copper layer side facing the insulating substrate; and forming a circuit by using any of a semi-additive process, a modified semi-additive process, a partly additive process, and a subtractive process.

The insulating substrate may be a substrate with an inner layer circuit.

As used herein, "semi-additive process" refers to a method in which thin non-electrolytic plating is performed on the insulating substrate or on a copper foil seed layer, and a conductor pattern is formed by performing electroplating and etching after the pattern formation.

Accordingly, an embodiment of the printed wiring board producing method according to the present invention using the semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

completely removing the ultrathin copper layer exposed upon detaching the carrier, using a method such as etching with an acid or other such corrosive solution, or using a plasma;

providing a through hole and/or a blind via through the resin exposed after the ultrathin copper layer is removed by etching;

performing a desmear process for a region containing the through hole and/or the blind via;

providing a non-electrolytic plating layer for the resin and the region containing the through hole and/or the blind via;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer by using a technique such as flash etching in a region other than the region where a circuit is to be formed.

Another embodiment of the printed wiring board producing method according to the present invention using the semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

performing a desmear process for a region containing the through hole and/or the blind via;

completely removing the ultrathin copper layer exposed upon detaching the carrier, using a method such as etching with an acid or other such corrosive solution, or using a plasma;

providing a non-electrolytic plating layer for the resin and the region containing the through hole and/or the blind via exposed after the ultrathin copper layer is removed by a method such as etching;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer by using a technique such as flash etching in a region other than the region where a circuit is to be formed.

Another embodiment of the printed wiring board producing method according to the present invention using the semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating resin substrate;

completely removing the ultrathin copper layer exposed upon detaching the carrier, using a method such as etching with an acid or other such corrosive solution, or using a plasma; performing a desmear process for a region containing the through hole and/or the blind via;

providing a non-electrolytic plating layer for the resin and the region containing the through hole and/or the blind via exposed after the ultrathin copper layer is removed by a method such as etching;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer by using a technique such as flash etching in a region other than the region where a circuit is to be formed.

Another embodiment of the printed wiring board producing method according to the present invention using the semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

completely removing the ultrathin copper layer exposed upon detaching the carrier, using a method such as etching with an acid or other such corrosive solution, or using a plasma;

providing a non-electrolytic plating layer for a surface of the resin exposed after the ultrathin copper layer is removed by etching;

providing a plating resist on the non-electrolytic plating layer;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer and the ultrathin copper layer by using a technique such as flash etching in a region other than the region where a circuit is to be formed.

As used herein, "modified semi-additive process" refers to a method in which a metal foil is laminated on an insulating layer, and the copper in a circuit forming portion is thickened by electrolytic plating while protecting a non-circuit forming portion with a plating resist. After removing the resist, the metal foil is removed by (flash) etching except in the circuit forming portion to form a circuit on the insulating layer.

Accordingly, an embodiment of the printed wiring board producing method according to the present invention using the modified semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating substrate;

performing a desmear process for a region containing the through hole and/or the blind via;

providing a non-electrolytic plating layer for the region containing the through hole and/or the blind via;

providing a plating resist on the surface of the ultrathin copper layer exposed upon detaching the carrier;

forming a circuit by electrolytic plating after the plating resist is provided;

removing the plating resist; and removing the ultrathin copper layer by flash etching after the ultrathin copper layer is exposed upon removal of the plating resist.

Another embodiment of the printed wiring board producing method according to the present invention using the modified semi-additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a plating resist on the ultrathin copper layer exposed upon detaching the carrier;

exposing the plating resist, and removing the plating resist in a region where a circuit is to be formed;

providing an electrolytic plating layer in the region from which the plating resist has been removed and where a circuit is to be formed;

removing the plating resist; and removing the non-electrolytic plating layer and the ultrathin copper layer by using a technique such as flash etching in a region other than the region where a circuit is to be formed.

As used herein, "partly additive process" refers to a method in which a catalyst colloid is applied to a substrate provided with a conductor layer, or to a substrate that has been drilled to form a through hole or a via hole as required. After forming a conductor circuit by etching, a solder resist or a plating resist is provided as needed, and a plating is applied to the conductor circuit, and to the through hole or via hole by performing a non-electrolytic plating process to produce a printed wiring board.

Accordingly, an embodiment of the printed wiring board producing method according to the present invention using the partly additive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating substrate;

performing a desmear process for a region containing the through hole and/or the blind via;

applying a catalyst colloid to the region containing the through hole and/or the blind via;

providing an etching resist on the surface of the ultrathin copper layer exposed upon detaching the carrier; exposing the etching resist, and forming a circuit pattern;

removing the ultrathin copper layer and the catalyst colloid using a method such as etching with an acid or other such corrosive solution, or using a plasma to form a circuit;

removing the etching resist;

providing a solder resist or a plating resist on the surface of the insulating substrate exposed after the ultrathin copper layer and the catalyst colloid are removed using a method such as etching with an acid or other such corrosive solution, or using a plasma; and providing a non-electrolytic plating layer in a region where the solder resist or the plating resist is not provided.

As used herein, "subtractive process" refers to a method in which unwanted portions of the copper foil on the copper-clad laminated board are selectively removed by etching or the like to form a conductor pattern.

Accordingly, an embodiment of the printed wiring board producing method according to the present invention using the subtractive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating substrate;

performing a desmear process for a region containing the through hole and/or the blind via;

providing a non-electrolytic plating layer for the region containing the through hole and/or the blind via;

providing an electrolytic plating layer on the surface of the non-electrolytic plating layer;

providing an etching resist on surfaces of the electrolytic plating layer and/or the ultrathin copper layer;

exposing the etching resist, and forming a circuit pattern;

removing the ultrathin copper layer, the non-electrolytic plating layer, and the electrolytic plating layer using a method such as etching with an acid or other such corrosive solution, or using a plasma to form a circuit; and removing the etching resist.

Another embodiment of the printed wiring board producing method according to the present invention using the subtractive process includes:

preparing a carrier-attached copper foil according to the present invention, and an insulating substrate;

laminating the carrier-attached copper foil and the insulating substrate to each other;

detaching the carrier of the carrier-attached copper foil after the carrier-attached copper foil and the insulating substrate are laminated to each other;

providing a through hole and/or a blind via through the ultrathin copper layer exposed upon detaching the carrier, and through the insulating substrate;

performing a desmear process for a region containing the through hole and/or the blind via;

providing a non-electrolytic plating layer for the region containing the through hole and/or the blind via;

forming a mask on a surface of the non-electrolytic plating layer;

providing an electrolytic plating layer on the non-electrolytic plating layer in a surface on which the mask is not formed;

providing an etching resist on surfaces of the electrolytic plating layer and/or the ultrathin copper layer;

exposing the etching resist, and forming a circuit pattern;

removing the ultrathin copper layer and the non-electrolytic plating layer using a method such as etching with an acid or other such corrosive solution, or using a plasma to form a circuit; and removing the etching resist.

The step of forming a through hole and/or a blind via, and the next desmear step may be omitted.

A specific example of the printed wiring board producing method using the carrier-attached copper foil of the present invention is described below with reference to the accompanying drawings. The following descriptions will be given through the case of a carrier-attached copper foil having an ultrathin copper layer with a roughening treatment layer formed thereon. However, the printed wiring board producing method is not limited to this example, and may be performed in the same manner with a carrier-attached copper foil having an ultrathin copper layer that does not have a roughening treatment layer.

First, as illustrated in FIG. 1-A, a carrier-attached copper foil with an ultrathin copper layer having formed thereon a roughening treatment layer (first carrier-attached copper foil layer) is prepared.

As illustrated in FIG. 1-B, a resist is applied to the roughening treatment layer on the ultrathin copper layer, and the resist is etched into a predetermined shape after exposure and development.

As illustrated in FIG. 1-C, the resist is removed after circuit plating formation, and a circuit plating of a predetermined shape is formed.

Figure 2:
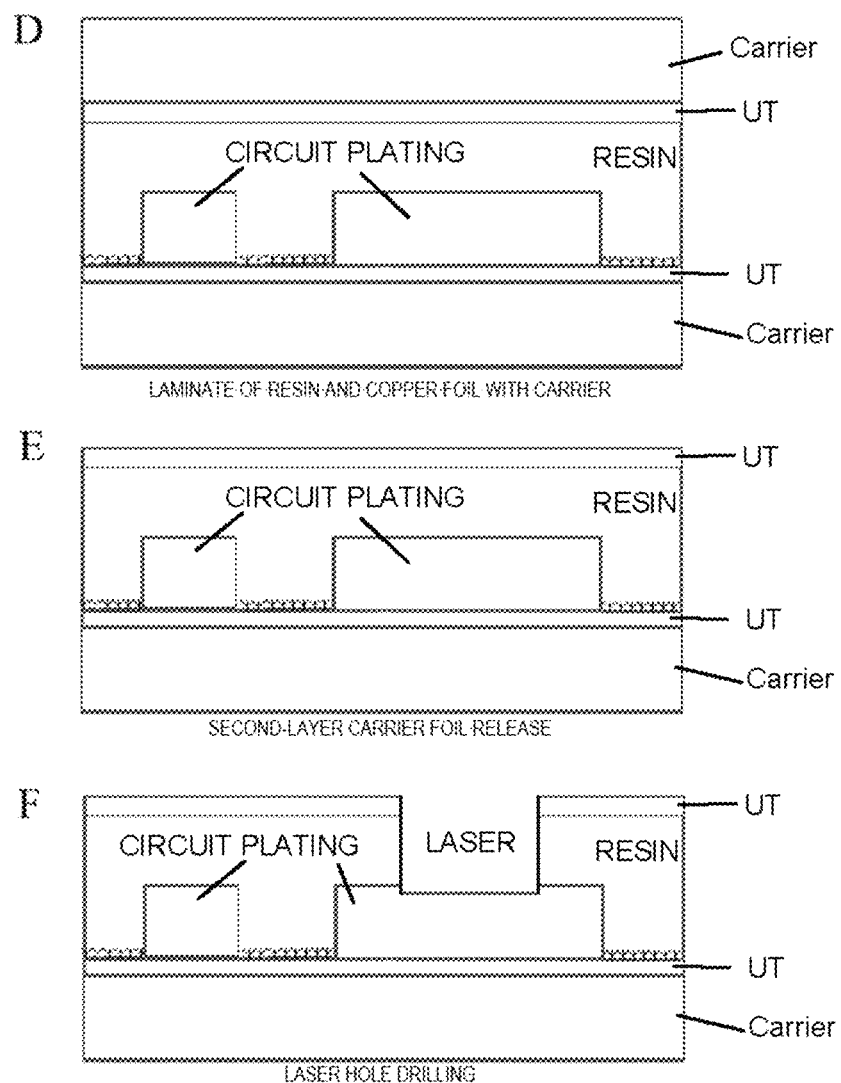
FIG. 2-D to 2-F are schematic views representing a wiring board cross section in processes from lamination of a resin and a second carrier-attached copper foil layer to laser drilling according to a specific example of the printed wiring board producing method using a carrier-attached copper foil of an embodiment of the present invention.

As illustrated in FIG. 2-D, an embedding resin is provided on the ultrathin copper layer so as to cover (embed) the circuit plating, and laminate a resin layer, and another carrier-attached copper foil (second carrier-attached copper foil layer) is bonded from the ultrathin copper layer side.

As illustrated in FIG. 2-E, the carrier is detached from the second carrier-attached copper foil layer.

As illustrated in FIG. 2-F, the resin layer is laser drilled at a predetermined position to expose the circuit plating and form a blind via.

Figure 3:
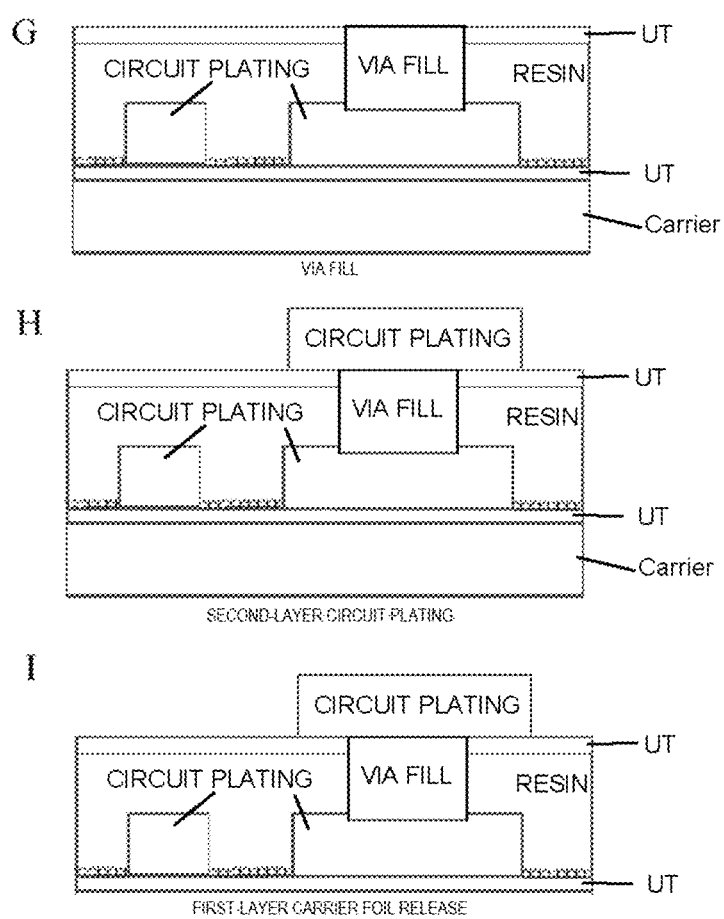
FIG. 3-G to 3-I are schematic views representing a wiring board cross section in processes from formation of a via fill to detachment of a first carrier layer according to a specific example of the printed wiring board producing method using a carrier-attached copper foil of an embodiment of the present invention.

As illustrated in FIG. 3-G, copper is embedded in the blind via to form a via fill.

As illustrated in FIG. 3-H, a circuit plating is formed on the via fill as in FIG. 1-B, and FIG. 1-C.

As illustrated in FIG. 3-I, the carrier is detached from the first carrier-attached copper foil layer.

Figure 4:
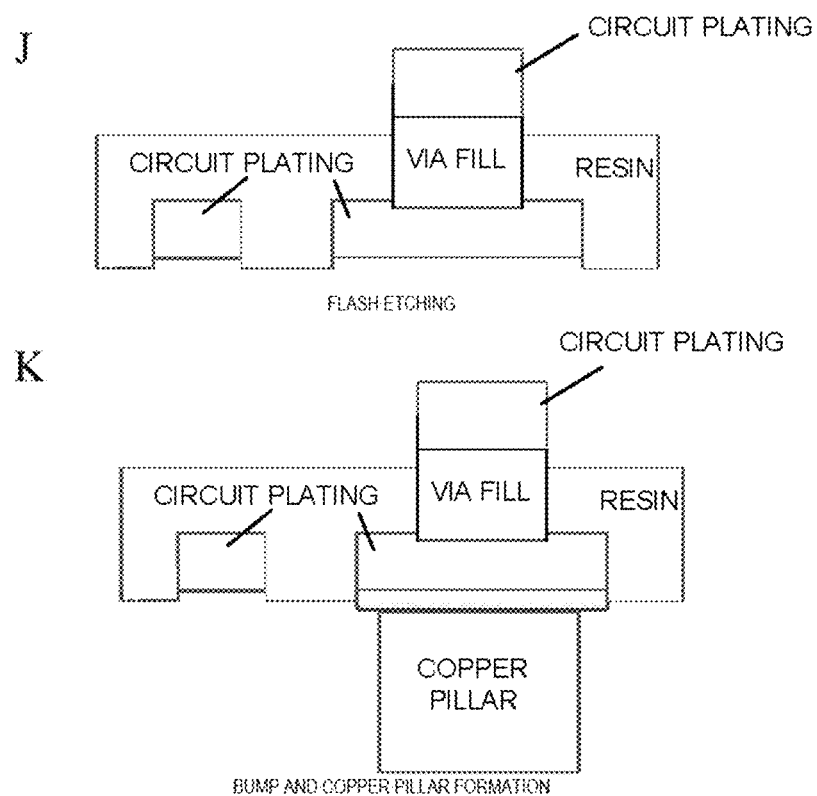
FIG. 4-J to 4-K are schematic views representing a wiring board cross section in processes from flash etching to formation of a bump and a copper pillar according to a specific example of the printed wiring board producing method using a carrier-attached copper foil of an embodiment of the present invention.

As illustrated in FIG. 4-J, the ultrathin copper layers are removed from the both surfaces by flash etching to expose the surface of the circuit plating in the resin layer.

As illustrated in FIG. 4-K, a bump is formed on the circuit plating in the resin layer, and a copper pillar is formed on the solder. This completes a printed wiring board using the carrier-attached copper foil of the embodiment of the present invention.

In the printed wiring board producing method described above, "ultrathin copper layer" may be read as carrier, and "carrier" may be read as ultrathin copper layer so that a circuit is formed on the carrier side of the carrier-attached copper foil, and embedded in the resin to produce a printed wiring board.

Aside from the carrier-attached copper foil of the embodiment of the present invention, the separate carrier-attached copper foil (second layer) may use a carrier-attached copper foil of related art, or a common copper foil. One or more circuit layers may be formed on the second circuit layer shown in FIG. 3-H. Such circuits may be formed by using any of the semi-additive process, the subtractive process, the partly additive process, and the modified semi-additive process.

The printed wiring board producing method described above produces a configuration in which the circuit plating is embedded in the resin layer. The circuit plating is thus protected by the resin layer, and can maintain its shape, for example, when removing the ultrathin copper layer by flash etching as in FIG. 4-J. The method thus makes it easier to form a finer circuit. Further, because the circuit plating is protected by the resin layer, anti-migration improves, and the conduction of circuit wires can be desirably reduced. This makes it easier to form a fine circuit. Further, because the exposed surface of the circuit plating becomes depressed into the resin layer upon removal of the ultrathin copper layer by flash etching as in FIG. 4-J and FIG. 4-K, it becomes easier to form a bump on the circuit plating, and the copper pillar on the bump. This improves the production efficiency.

Known resins, and known prepregs may be used as the embedding resin (resin). For example, a BT (bismaleimide triazine) resin, a prepreg as a BT resin-impregnated glass fabric, or an ABF film or an ABF (manufactured by Ajinomoto Fine-Techno Co., Ltd.) may be used. The embedding resin (resin) may use the resin layer, and/or the resin, and/or the prepreg, and/or the film described in this specification.

The carrier-attached copper foil used as the first layer may have a substrate or a resin layer on a surface of the carrier-attached copper foil. The substrate or resin layer supports the first-layer carrier-attached copper foil, and the carrier-attached copper foil becomes less likely to wrinkle. This is advantageous in terms of productivity. The substrate or the resin layer may be any substrate or resin layer, provided that it has the effect to support the carrier-attached copper foil used as the first layer. For example, the substrate and the resin layer may be any of the carriers, the prepregs, and the resin layers described in this specification as substrates or resin layers, or may be a known carrier, prepreg, resin layer, metal board, metal foil, inorganic compound board, inorganic compound foil, organic compound board, or organic compound foil.

The printed wiring board producing method of the present invention may be a printed wiring board producing method (coreless method) that includes:

laminating a resin substrate to the surface of the carrier-attached copper foil of the present invention on the ultrathin copper layer side or on the carrier side;

providing a dual layer of resin and circuit at least once on the carrier-attached copper foil surface opposite the ultrathin copper layer side or the carrier side laminated to the resin substrate; and detaching the carrier or the ultrathin copper layer from the carrier-attached copper foil after forming the dual layer of resin and circuit.

As a specific example of the coreless method, a resin substrate is laminated to the surface of the carrier-attached copper foil of the present invention on the ultrathin copper layer side or the carrier side to produce a laminate (a copper-clad laminated board, or a copper-clad laminate). A resin layer is then formed on the carrier-attached copper foil surface opposite the ultrathin copper layer side or the carrier side laminated to the resin substrate. The carrier side or the ultrathin copper layer side of another carrier-attached copper foil may be laminated to the resin layer formed on the carrier-side surface or the ultrathin copper layer-side surface. In this case, the printed wiring board producing method (coreless method) may be applied to (i) a laminate of a configuration in which the carrier-attached copper foil is laminated to the both surfaces of a center resin substrate in order of carrier/interlayer/ultrathin copper layer, or ultrathin copper layer/interlayer/carrier, (ii) a laminate of a configuration in which the carrier-attached copper foil is laminated to the both surfaces of a center resin substrate in order of carrier/interlayer/ultrathin copper layer/resin substrate/ultrathin copper layer/interlayer/carrier, (iii) a laminate of a configuration in which the carrier-attached copper foil is laminated to the both surfaces of a center resin substrate in order of carrier/interlayer/ultrathin copper layer/resin substrate/carrier/interlayer/ultrathin copper layer, or (iv) a laminate of a configuration in which the carrier-attached copper foil is laminated to the both surfaces of a center resin substrate in order of ultrathin copper layer/interlayer/carrier/resin substrate/carrier/interlayer/ultrathin copper layer.

The exposed surface of the ultrathin copper layer or the carrier at the both ends may be further provided with another resin layer, and a circuit may be formed by processing a copper layer or a metal layer after providing these layers. Yet another resin layer may be provided on the circuit in such a manner that the circuit is embedded in the resin layer. Such circuit and resin layer formation may be performed one or more times (build-up method). The laminate (hereinafter, also referred to as "laminate B") formed in the manner described above may be used to fabricate a coreless substrate upon detaching the ultrathin copper layer or the carrier of each carrier-attached copper foil from the carrier or the ultrathin copper layer. For the fabrication of the coreless substrate, two carrier-attached copper foils may be used to produce a laminate of an ultrathin copper layer/interlayer/carrier/carrier/interlayer/ultrathin copper layer configuration, a laminate of a carrier/interlayer/ultrathin copper layer/ultrathin copper layer/interlayer/carrier configuration, or a laminate of a carrier/interlayer/ultrathin copper layer/carrier/interlayer/ultrathin copper layer configuration, and the laminate may be used at the center.

A dual layer of resin and circuit may be provided at least once on the ultrathin copper layer surface or the carrier surface on the both sides of such a laminate (hereinafter, also referred to as "laminate A"). After one or more formation of the dual layer of resin and circuit, the ultrathin copper layer or the carrier of each carrier-attached copper foil may be detached from the carrier or the ultrathin copper layer to fabricate a coreless substrate. The laminate may include other layers on the ultrathin copper layer surface, on the carrier surface, between the carriers, between the ultrathin copper layers, or between the ultrathin copper layer and the carrier. Other layers may be resin layers or resin substrates. As used herein, "ultrathin copper layer surface", "ultrathin copper layer-side surface", "ultrathin copper layer surface", "carrier surface", "carrier-side surface", "carrier surface", "surface of laminate", and "laminate surface" are a concept that encompasses the surface (outermost surface) of other layers when the ultrathin copper layer, the carrier, and the laminate have other layers on the ultrathin copper layer surface, the carrier surface, and the laminate surface. Preferably, the laminate has an ultrathin copper layer/interlayer/carrier/carrier/interlayer/ultrathin copper layer configuration. This is because, when such a laminate is used to fabricate a coreless substrate, the ultrathin copper layer will be disposed on the coreless substrate side, and a circuit can more easily be formed on the coreless substrate using the modified semi-additive process. Another reason is that, because of the thin thickness of the ultrathin copper layer, it becomes easier to remove the ultrathin copper layer, and form a circuit on a coreless substrate in the semi-additive process after the removal of the ultrathin copper layer.

Note that the term "laminate", when used without being specified as "laminate A" or "laminate B", refers to laminates that include at least laminate A and laminate B.

In the method of production of a coreless substrate above, by covering the end surfaces of the carrier-attached copper foil or the laminate (laminate A) either in part or as a whole with resin, seeping of chemicals into the interlayer or between the two carrier-attached copper foils constituting the laminate can be prevented during the production of a printed wiring board by the build-up method. Separation of the ultrathin copper layer and the carrier due to chemical seeping, and corrosion of the carrier-attached copper foil also can be prevented to improve yield. Here, a resin that can be used for the resin layer can be used as the resin that covers a part of or the whole end surfaces of the carrier-attached copper foil, or as the resin that covers a part of or the whole end surfaces of the laminate.

In the method of production of a coreless substrate above, a resin or a prepreg may cover at least a part of the periphery of the laminated portion of the carrier-attached copper foil or the laminate (the laminated portion between the carrier and the ultrathin copper layer, or the laminated portion between two carrier-attached copper foils) in a planar view of the carrier-attached copper foil or the laminate. The laminate (laminate A) formed by the method of production of a coreless substrate above may be configured as a laminate in which a pair of carrier-attached copper foils are separably in contact with each other. A resin or a prepreg may cover the whole periphery of the laminated portion of the carrier-attached copper foil or the laminate (the laminated portion between the carrier and the ultrathin copper layer, or the laminated portion between two carrier-attached copper foils) in a planar view of the carrier-attached copper foil. Preferably, the resin or prepreg is larger than the carrier-attached copper foil, the laminate, or the laminated portion of the laminate in planar view, and it is preferable to make a laminate of a configuration in which the carrier-attached copper foil or the laminate is enveloped (contained) with the resin or prepreg laminated on the both surfaces of the carrier-attached copper foil or the laminate. With such a configuration, the resin or prepreg covering the laminated portion of the carrier-attached copper foil or the laminate can prevent the laminated portion from contacting other members from the side, specifically from a lateral direction with respect to the direction of lamination, in a planar view of the carrier-attached copper foil or the laminate. This makes it possible to reduce the risk of detachment between the carrier and the ultrathin copper layer, or between the carrier-attached copper foils during handling. By covering the periphery of the laminated portion of the carrier-attached copper foil or the laminate with a resin or a prepreg to prevent exposure, entry of chemicals at the interface of the laminated portion can be prevented in the chemical processes described above, and the carrier-attached copper foil can be prevented from being corroded or eroded. When separating one of the carrier-attached copper foils from a pair of carrier-attached copper foils in the laminate, or when separating the carrier and the copper foil (ultrathin copper layer) of the carrier-attached copper foil, it may be necessary to remove the laminated portion or other portions by, for example, cutting the necessary portion in case where the laminated portion of the carrier-attached copper foil or the laminate covered with a resin or a prepreg (the laminated portion between the carrier and the ultrathin copper layer, or the laminated portion between two carrier-attached copper foils) is strongly bonded with the resin or prepreg, or with other materials.

The carrier side or the ultrathin copper layer side of the carrier-attached copper foil of the present invention may be laminated to the carrier side or the ultrathin copper layer side of another carrier-attached copper foil of the present invention to construct a laminate. The laminate may be one in which the carrier-side surface or the ultrathin copper layer-side surface of the carrier-attached copper foil is directly laminated to the carrier-side surface or the ultrathin copper layer-side surface of another carrier-attached copper foil with an adhesive, if need be. The carrier or the ultrathin copper layer of the carrier-attached copper foil may be joined to the carrier or the ultrathin copper layer of another carrier-attached copper foil. As used herein, "join" encompasses joining via a surface treatment layer when the carrier or the ultrathin copper layer has a surface treatment layer. A part of or the whole end surfaces of the laminate may be covered with resin.

Aside from simple lamination, the lamination between the carriers, between the ultrathin copper layers, between the carrier and the ultrathin copper layer, and between the carrier-attached copper foils may be achieved, for example, using the following methods.

(a) Metallurgical joining method: Fusion welding (arc welding, TIG (tungsten inert gas) welding, MIG (metal inert gas) welding, resistance welding, seam welding, spot welding), pressure welding (ultrasonic welding, friction stir welding), and brazing and soldering;

(b) Mechanical joining method: joining by swaging or riveting, (joining by self-piercing riveting, joining by riveting), stitcher;

(c) Physical joining method: adhesive, (double-sided) adhesive tape

By joining a part or the whole of the carrier to a part or the whole of the other carrier or to a part or the whole of the ultrathin copper layer using the foregoing joining methods, it is possible to produce a laminate of a configuration in which the carrier is laminated to the other carrier or to the ultrathin copper layer, and in which the carriers or the carrier and the ultrathin copper layer are separably in contact with each other. When the carrier is laminated to the other carrier or to the ultrathin copper layer by being weakly joined to the other carrier or to the ultrathin copper layer, the carrier can be separated from the other carrier or from the ultrathin copper layer without removing the portion joining the carrier to the other carrier or to the ultrathin copper layer. When the carrier is strongly joined to the other carrier or to the ultrathin copper layer, the carrier can be separated from the other carrier or from the ultrathin copper layer by removing the joined portion between the carriers by means of, for example, cutting, chemical polishing (such as etching), or mechanical polishing.

A printed wiring board can be fabricated by providing a dual layer of resin and circuit at least once for the laminate configured as above, and detaching the ultrathin copper layer or the carrier from the carrier-attached copper foil of the laminate after the dual layer of resin and circuit is formed at least once. The dual layer of resin and circuit may be provided on one or both surfaces of the laminate.

The resin substrate, the resin layer, the resin, and the prepreg used for the laminate may be the resin layer described in this specification, and may contain materials such as resins, resin curing agents, compounds, curing promoting agents, dielectrics, reaction catalysts, crosslinking agents, polymers, prepregs, and skeleton materials used for the resin layer described in this specification. The carrier-attached copper foil may be smaller than the resin or prepreg as viewed in a planar view.

EXAMPLES

The present invention is described below in greater detail referring to Examples of the present invention. However, the present invention is in no way limited by the following Examples.

A copper foil carrier was fabricated as follows.

Inside an electrolysis vessel were disposed a titanium rotary drum, and electrodes, which were disposed around the drum with a distance in between. Copper was deposited on the rotary drum surface by performing electrolysis in the electrolysis vessel, and the copper deposited on the rotary drum surface was scraped off to continuously produce an 18 μm-thick electrolytic copper foil as a copper foil carrier. The rotary drum had a chromium plated SUS surface, and was used after being buffed. Because the surface shape of the rotary drum directly translates into the surface shape of the copper foil carrier produced, the surface shape of the copper foil carrier (surface roughnesses Sz and Sa, and 60-degree specular glossiness) was controlled by adjusting the rotation speed of the rotary drum, the feed rate of the polishing belt, and the grit of the abrasive grain of the buff used for buffing.

The electrolytic copper foil (copper foil carrier) was formed under the following conditions.

Experiment Nos. 1 to 14, and 22 to 53
Electrolytic Solution Composition
  Copper: 100 g/L
  Sulfuric acid: 100 g/L
  Chlorine: 65 ppm
Electrolysis Conditions
  Current density: 80 A/dm$^2$
  Electrolytic solution temperature: 55° C.
  Electrolytic solution linear velocity: 4 m/sec
  Electrolysis time: 60 s The surface roughnesses Sz and Sa, and the 60-degree specular glossiness in MD direction of the copper foil carrier fabricated under these conditions are presented in Tables 2 to 4.

Experiment No. 54
Electrolytic Solution Composition
  Copper: 100 g/L
  Sulfuric acid: 100 g/L
  Chlorine: 120 ppm
Electrolysis Conditions
  Current density: 80 A/dm$^2$
  Electrolytic solution temperature: 65° C.
  Electrolytic solution linear velocity: 4 m/sec
  Electrolysis time: 60 s Experiment No. 55
Electrolytic Solution Composition
  Copper: 100 g/L
  Sulfuric acid: 100 g/L
  Chlorine: 100 ppm
  Gloss Agents:
  Leveling agent 1 (bis(3-sulfopropyl)disulfide): 1 ppm
  Leveling agent 2 (amine compound): 1 ppm The amine compound used had the following chemical formula.

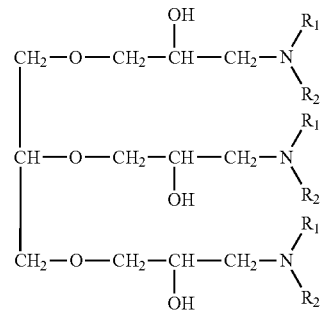

(In the chemical formula, $R_1$ and $R_2$ are methyl groups.)
Electrolysis Conditions
  Current density: 80 A/dm$^2$
  Electrolytic solution temperature: 55° C.
  Electrolytic solution linear velocity: 4 m/sec
  Electrolysis time: 60 s Experiment No. 56
Electrolytic Solution Composition
  Copper: 100 g/L
  Sulfuric acid: 100 g/L
  Chlorine: 65 ppm
  Gloss Agents:
  Leveling agent 1 (bis(3-sulfopropyl)disulfide): 3 ppm
  Leveling agent 2 (amine compound): 3 ppm The amine compound used had the following chemical formula.

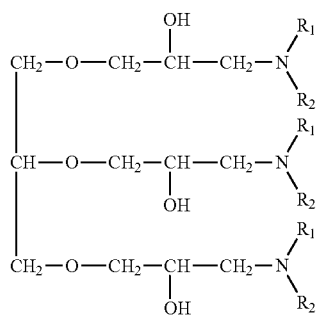

(In the chemical formula, $R_1$ and $R_2$ are methyl groups.)
Electrolysis Conditions
 Current density: 80 A/dm$^2$
 Electrolytic solution temperature: 55° C.
 Electrolytic solution linear velocity: 4 m/sec
 Electrolysis time: 60 s
Experiment Nos. 15 to 20, 57 to 58, and 60 to 61
 Inside an electrolysis vessel were disposed a titanium rotary drum, and electrodes, which were disposed around the drum with a distance in between. Copper was then deposited on the rotary drum surface by performing electrolysis in the electrolysis vessel under the carrier foil producing conditions shown in Table 1. The copper deposited on the rotary drum surface was scraped off to continuously produce an 18 μm-thick electrolytic copper foil as a copper foil carrier.
Experiment No. 59
 Apress-rolled copper foil (tough pitch copper, JIS H3100 C1100) was prepared under the carrier foil producing conditions shown in Table 1, and the press-rolled copper foil was finished by cold rolling with pressure rolls that had been sandblasted to have a roughening surface. The pressure rolls had a roughness Ra of 0.39 to 0.42 μm, and an oil film equivalent of 35,000. This completed the copper foil carrier.

The copper foil carrier was subjected to a surface treatment as follows.
Experiment Nos. 1 to 2, 22 to 23, and 36 to 37
 The glossy surface (also called "shiny surface", or "S surface") of the electrolytic copper foil (copper foil carrier) was etched with an aqueous solution containing 500 g/L of sulfuric acid, 50 g/L of hydrogen peroxide, and 5 g/L of additive component 1,2,3-benzotriazole at the following temperatures for the following durations.
Etching Conditions (Temperature, Time)
 Experiment Nos. 1, 22, and 36: (35° C., 30 s)
 Experiment Nos. 2, 23, and 37: (25° C., 30 s)
Experiment Nos. 3, 24, 38, and 57 to 60
 The copper foil carrier was directly subjected to the interlayer treatment below, without performing the surface treatment.
Experiment Nos. 4 to 7, 21, 25 to 28, 39 to 42, 50 to 53
 The glossy surface (also called "shiny surface", or "S surface") of the electrolytic copper foil (copper foil carrier) or the press-rolled copper foil was soft etched with an aqueous solution containing 100 g/L of sulfuric acid, 50 g/L of potassium persulfate, and 5 g/L of additive component 1,2,3-benzotriazole at the following temperatures for the following durations.
Etching Conditions (Temperature, Time)
 Experiment Nos. 4, 25, 39, 50: (35° C., 10 s)
 Experiment Nos. 5, 26, 40, 51: (35° C., 60 s)
 Experiment Nos. 6, 27, 41, 52: (25° C., 10 s)
 Experiment Nos. 7, 28, 42, 53: (25° C., 60 s)
 Experiment No. 21: (35° C., 45 s)
Experiment Nos. 8, 29, 43
 The glossy surface (also called "shiny surface", or "S surface") of the electrolytic copper foil (copper foil carrier) was soft etched with an aqueous solution containing 20 g/L of sulfuric acid, 10 g/L of hydrogen peroxide, and 1 g/L of additive component 1,2,3-benzotriazole at the following temperature for the following duration.
Etching Conditions (Temperature, Time)
 Experiment Nos. 8, 29, 43: (35° C., 30 s)
Experiment Nos. 9, 30, 44

TABLE 1

| | Carrier foil producing conditions | | |
|---|---|---|---|
| Experiment No. | Electrolytic solution | Current Density (A/dm$^2$) | Linear velocity of electrolytic solution (m/sec) |
| 15-19 | Copper: 100 g/L, sulfuric acid: 100 g/L, chlorine: 50 ppm, leveling agent 1 (bis(3-sulfopropyl)disulfide): 10 to 30 ppm, leveling agent 2 (amine compound): 10 to 39 ppm, remainder: water | 85 | 4.0 |
| 57 | Copper concentration: 90 g/L, sulfuric acid concentration: 80 g/L, glue concentration: 3.5 mass ppm, remainder: water | 85 | 4.0 |
| 58 | Copper concentration: 90 g/L, sulfuric acid concentration: 80 g/L, glue concentration: 4.0 mass ppm, remainder: water | 85 | 4.0 |
| 20 | Copper: 100 g/L, sulfuric acid: 100 g/L, chlorine: 50 ppm, leveling agent 1 (bis(3-sulfopropyl)disulfide): 5 to 10 ppm, leveling agent 2 (amine compound): 8 to 20 ppm, remainder: water | 85 | 4.0 |
| 59 | Press-rolled copper foil (tough pitch copper, JIS H3100 C1100), finished with cold rolling with pressure rolls sandblasted to have a coarse surface. Pressure roll roughness Ra = 0.39 to 0.42 μm, oil film equivalent: 35,000 | | |
| 60 | Copper concentration: 90 g/L, Sulfuric acid concentration: 80 g/L, glue concentration: 6.0 mass ppm, remainder: water | 85 | 3.8 |
| 61 | Copper: 100 g/L, sulfuric acid: 100 g/L, chlorine: 50 ppm, leveling agent 1 (bis(3-sulfopropyl)disulfide): 5 to 10 ppm, leveling agent 2 (amine compound): 8 to 20 ppm, remainder: water | 85 | 4.0 |

The glossy surface (also called "shiny surface", or "S surface") of the electrolytic copper foil (copper foil carrier) was soft etched with an aqueous solution containing 20 g/L of sulfuric acid, 10 g/L of potassium persulfate, and 1 g/L of additive component carboxybenzotriazole at the following temperature for the following duration.
Etching Conditions (Temperature, Time)
    Experiment Nos. 9, 30, 44: (35° C., 30 s)
Experiment Nos. 10, 31, 45
The glossy surface (also called "shiny surface", or "S surface") of the electrolytic copper foil (copper foil carrier) was soft etched with an aqueous solution containing 100 g/L of sulfuric acid, 50 g/L of ammonium persulfate, and 5 g/L of additive component 1H-1,2,4-triazole at the following temperature for the following duration.
Etching Conditions (Temperature, Time)
    Experiment Nos. 10, 31, 45: (25° C., 5 s)
Experiment Nos. 11 to 14, 32 to 35, 46 to 49
The glossy surface (also called "shiny surface", or "S surface") of the electrolytic copper foil (copper foil carrier) was soft etched with an aqueous solution containing 100 g/L of sulfuric acid, 20 g/L of hydrogen peroxide, and 5 g/L of additive component 1,2,3-benzotriazole at the following temperatures for the following durations.
Etching Conditions (Temperature, Time)
    Experiment Nos. 11, 32, 46: (35° C., 10 s)
    Experiment Nos. 12, 33, 47: (35° C., 60 s)
    Experiment Nos. 13, 34, 48: (25° C., 10 s)
    Experiment Nos. 14, 35, 49: (25° C., 60 s)
Experiment No. 15
The non-glossy surface (also called "matte surface", or "M surface") of the electrolytic copper foil (copper foil carrier) was soft etched with an aqueous solution containing 10 vol % of sulfuric acid, and 2.0 wt % of hydrogen peroxide at the following temperature for the following duration.
Etching Conditions (Temperature, Time)
    Experiment No. 15: (25° C., 1 min)
Experiment No. 16
A cathode was disposed on the glossy surface (also called "shiny surface", or "S surface") side of the electrolytic copper foil (copper foil carrier). By using the copper foil as anode, a DC electrolytic process (process solution: 100 g/L sulfuric acid) was performed to reverse electropolish the glossy surface of the copper foil, and dissolve the copper in 5 g per unit area (1 m$^2$) of the carrier (5 g/m$^2$). The reverse electropolishing was performed at a current density of 10 A/dm$^2$, and a process temperature of 30° C.
Experiment No. 17
The electrolytic copper foil (copper foil carrier) was directly subjected to the interlayer treatment below, without performing the surface treatment.
Experiment No. 18
The non-glossy surface (also called "matte surface", or "M surface") of the electrolytic copper foil (copper foil carrier) was soft etched with an aqueous solution containing 10 vol % of sulfuric acid, and 1.5 wt % of hydrogen peroxide at the following temperature for the following duration.
Etching Conditions (Temperature, Time)
    Experiment No. 18: (25° C., 1 min)
Experiment No. 19
A cathode was disposed on the glossy surface (also called "shiny surface", or "S surface") side of the electrolytic copper foil (copper foil carrier). By using the copper foil as anode, a DC electrolytic process (process solution: 100 g/L sulfuric acid) was performed to reverse electropolish the glossy surface of the copper foil, and dissolve the copper in 12 g per unit area (1 m$^2$) of the carrier (12 g/m$^2$). The reverse electropolishing was performed at a current density of 20 A/dm$^2$, and a process temperature of 30° C.
Experiment No. 20
The non-glossy surface (also called "matte surface", or "M surface") of the electrolytic copper foil (copper foil carrier) was soft etched with an aqueous solution containing 10 vol % of sulfuric acid, and 2.0 wt % of hydrogen peroxide at the following temperature for the following duration.
Etching Conditions (Temperature, Time)
    Experiment No. 20: (25° C., 1 min)
Experiment Nos. 54 to 56
The glossy surface (also called "shiny surface", or "S surface") of the electrolytic copper foil (copper foil carrier) was soft etched with an aqueous solution containing 20 g/L of sulfuric acid, 10 g/L of hydrogen peroxide, and 10 g/L of additive component 1,2,3-benzotriazole at the following temperature for the following duration.
Etching Conditions (Temperature, Time)
    Experiment Nos. 54 to 56: (25° C., 1 min)
Experiment No. 61
The non-glossy surface (also called "matte surface", or "M surface") of the electrolytic copper foil (copper foil carrier) was soft etched with an aqueous solution containing 10 vol % of sulfuric acid, and 8.0 wt % of hydrogen peroxide at the following temperature for the following duration.
Etching Conditions (Temperature, Time)
    Experiment No. 61: (25° C., 1 min)
The interlayer was formed under the following conditions in Experiment Nos. 1 to 49, and 54 to 61. Electroplating was performed in a roll-to-roll continuous plating line under the following conditions to form a Ni layer in a deposit amount of 4,000 μg/dm$^2$.
Ni Layer
    Nickel sulfate: 250 to 300 g/L
    Nickel chloride: 35 to 45 g/L
    Nickel acetate: 10 to 20 g/L
    Trisodium citrate: 15 to 30 g/L
    Gloss agent: saccharin, butynediol, etc.
    Sodium dodecyl sulfate: 30 to 100 ppm
    pH: 4 to 6
    Liquid temperature: 50 to 70° C.
    Current density: 3 to 15 A/dm$^2$
After water washing and acid washing, a Cr layer was attached to the Ni layer in a deposition amount of 11 μg/dm$^2$ on the roll-to-roll continuous plating line by performing an electrolytic chromate treatment under the following conditions.
Electrolytic Chromate Treatment
    Solution composition: 1 to 10 g/L of potassium dichromate, and 0 to 5 g/L of zinc
    pH: 3 to 4
    Liquid temperature: 50 to 60° C.
    Current density: 0.1 to 2.6 A/dm$^2$
    Coulomb quantity: 0.5 to 30 As/dm$^2$
In Experiment No. 50, the interlayer was formed under the following conditions.
Electroplating was performed in a roll-to-roll continuous plating line under the following conditions to form a Ni—Mo layer in a deposit amount of 3,000 μg/dm$^2$.
Ni—Mo Layer (Nickel-Molybdenum Alloy Plating)
    Solution composition: sodium sulfate hexahydrate: 50 g/dm$^3$, sodium molybdate dihydrate: 60 μg/dm$^3$, sodium citrate: 90 μg/dm$^3$
    Liquid temperature: 30° C.
    Current density: 1 to 4 A/dm$^2$
    Energization time: 3 to 25 s In Experiment No. 51, the interlayer was formed under the following conditions.
Ni Layer
The Ni layer was formed under the same conditions used in Experiment Nos. 1 to 49, and 54 to 61.
Organic Material Layer (Organic Material Layer Forming Process)
After water washing and acid washing the surface of the Ni layer, an aqueous solution having a liquid temperature of 40° C. and pH 5, and containing 1 to 30 g/L of carboxybenzotriazole (CBTA) was showered onto the Ni layer surface for 20 to 120 s under the conditions below to form an organic material layer.

In Experiment No. 52, the interlayer was formed under the following conditions.
An organic material layer was formed by performing a surface treatment in a roll-to-roll continuous plating line under the conditions below.
Organic Material Layer (Organic Material Layer Forming Process)
The organic material layer was formed under the same conditions used in Experiment No. 51.
Ni Layer
A Ni layer was formed on the surface of the organic material layer under the same conditions used in Experiment Nos. 1 to 49, and 54 to 61.

In Experiment No. 53, the interlayer was formed under the following conditions.
Electroplating was performed in a roll-to-roll continuous plating line under the following conditions to form a Co—Mo layer in a deposit amount of 4,000 μg/dm².
Co—Mo Layer (Cobalt Molybdenum Alloy Plating)
Electroplating was performed on the carrier in a roll-to-roll continuous plating line to form a Co—Mo layer in a deposit amount of 4,000 μg/dm². The specific plating conditions are as follows.
Solution composition: cobalt sulfate: 50 μg/dm³, sodium molybdate dihydrate: 60 μg/dm³, sodium citrate: 90 μg/dm³
Liquid temperature: 30° C.
Current density: 1 to 4 A/dm²
Energization time: 3 to 25 s After forming the interlayer, an ultrathin copper layer was formed on the interlayer in thicknesses of 1, 2, and 3 μm to form a carrier-attached copper foil by performing electroplating under the following conditions.
Ultrathin Copper Layer
  Copper concentration: 30 to 120 g/L
  $H_2SO_4$ concentration: 20 to 120 g/L
  Electrolytic solution temperature: 20 to 80° C.
  Current density: 10 to 100 A/dm²

In Experiment Nos. 6, 26, and 45, a roughening treatment layer, an anti-heat treatment layer, a chromate layer, and a silane coupling process layer were provided on the ultrathin copper layer.
Roughening Treatment
  Cu: 10 to 20 g/L
  Co: 1 to 10 g/L
  Ni: 1 to 10 g/L
  pH: 1 to 4
  Temperature: 40 to 50° C.
  Current density Dk: 20 to 30 A/dm²
  Time: 1 to 5 s
  Cu deposit amount: 15 to 40 mg/dm²
  Co deposit amount: 100 to 3,000 μg/dm²
  Ni deposit amount: 100 to 1,000 μg/dm²

Anti-Heat Treatment
  Zn: 0 to 20 g/L
  Ni: 0 to 5 g/L
  pH: 3.5
  Temperature: 40° C.
  Current density Dk: 0 to 1.7 A/dm²
  Time: 1 s
  Zn deposit amount: 5 to 250 μg/dm²
  Ni deposit amount: 5 to 300 μg/dm²
Chromate Treatment
  $K_2Cr_2O_7$ ($Na_2Cr_2O_7$ or $CrO_3$): 2 to 10 g/L
  NaOH or KOH: 10 to 50 g/L
  ZnO or $ZnSO_4 7H_2O$: 0.05 to 10 g/L
  pH: 7 to 13
  Bath temperature: 20 to 80° C.
  Current density: 0.05 to 5 A/dm²
  Time: 5 to 30 s
  Cr deposit amount: 10 to 150 μg/dm²
Silane Coupling Process
  Vinyltriethoxysilane aqueous solution
  (vinyltriethoxysilane concentration: 0.1 to 1.4 wt %)
  pH: 4 to 5
  Time: 5 to 30 s
Experiment No. 21

A press-rolled copper foil (tough pitch copper, JIS H3100 C1100) was prepared, and was finished by cold rolling with pressure rolls that had been sandblasted to have a roughening surface. The pressure rolls had a roughness Ra of 0.45 to 0.48 μm, and an oil film equivalent of 41,000. This completed the copper foil carrier.

A carrier-attached copper foil was fabricated upon forming the interlayer and the ultrathin copper layer on the copper foil carrier surface under the same conditions used in Experiment No. 6.

The carrier-attached copper foils obtained in Experiment Nos. 1 to 61 above were evaluated as follows.
Thickness of Ultrathin Copper Layer The thickness of the ultrathin copper layer was measured by using a gravimetric method, as follows.

After measuring the weight of the carrier-attached copper foil, the ultrathin copper layer was peeled off, and the carrier weight was measured. The difference between the two measured weights was defined as the weight of the ultrathin copper layer.
Sample size: A 10 cm×10 cm sheet (a 10 cm×10 cm sheet punched with a pressing machine)
Sample collection: Arbitrarily chosen three locations The thickness of the ultrathin copper layer was calculated by using a gravimetric method for each sample, using the following formula.

Thickness of ultrathin copper layer by gravimetric method (μm)={(weight of the carrier-attached copper foil from a 10 cm×10 cm sheet (g/100 cm²))−(carrier weight after the ultrathin copper layer was peeled off from the carrier-attached copper foil from the 10 cm×10 cm sheet (g/100 cm²))}/copper density (8.96 g/cm³)×0.01 (100 cm²/cm²)× 10,000 μm/cm A four decimal place balance was used for the sample weight measurement. The measured weight value was directly used for the calculation above.

The arithmetic mean value of the ultrathin copper layer thicknesses measured at three locations by using a gravimetric method was used as the gravimetric thickness of the ultrathin copper layer.

A precision balance IBA-200 (manufactured by As One Corporation), and a pressing machine HAP-12 (manufactured by Noguchi Press Co., Ltd.) were used.

When a surface treatment layer such as the roughening treatment layer was formed on the ultrathin copper layer, the measurements were performed after forming the surface treatment layer.

It was confirmed that the ultrathin copper layer had a thickness of 1 to 3 µm in all of Experiment Nos. 1 to 61.
Surface Roughness of Ultrathin Copper Layer The carrier-attached ultrathin copper layer, and the base (GHPL-832NX-A manufactured by Mitsubishi Gas Chemical Company) were heat pressed, and laminated at 220° C. for 2 h under the pressure of 20 kgf/cm², and the copper foil carrier was peeled off according to JIS C 6471 1995 to expose the ultrathin copper layer (the copper foil was peeled off according to Method A, Type (1) of the 8.1.1. Test Method in 8.1 Copper Foil Peel Strength (copper foil is peeled off in 90° direction with respect to the copper foil surface being removed)). The exposed surface of the ultrathin copper layer was then measured for roughnesses using the following procedures.

Figure 5:
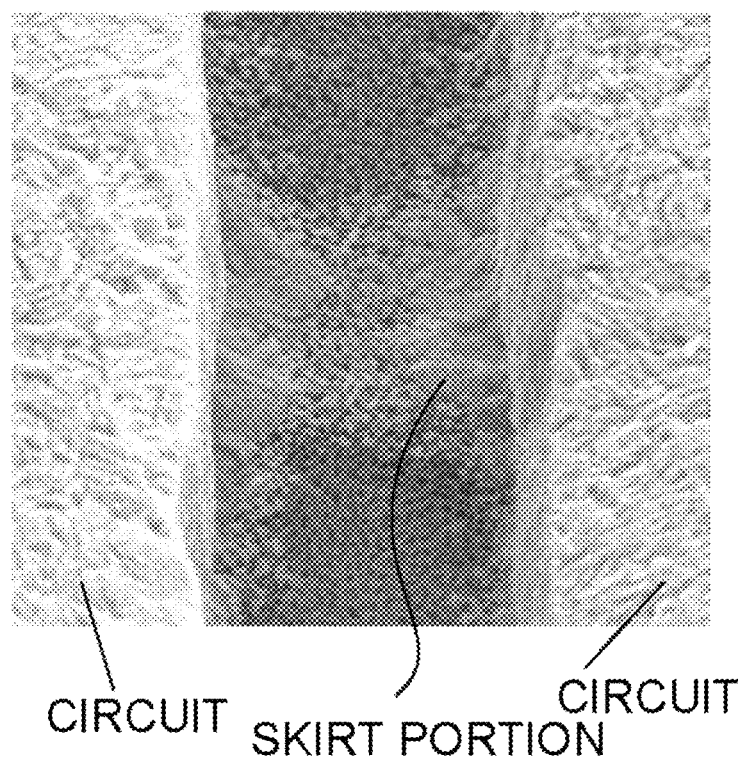
FIG. 5 is a schematic view representing a cross section of a circuit showing a skirt portion according to Example.

The exposed surface of the ultrathin copper layer was measured for Sz (maximum height), and Sa (arithmetic mean height) according to ISO 25178, using a laser microscope OLS4000 (LEXT OLS 4000, Olympus). The same Sz and Sa measurements were also performed for the carrier surface to be provided with the ultrathin copper layer, before and after the surface treatment. The measurements were made in an about 200 µm×200 µm area (specifically, 40,106 µm²) with a laser microscope fitted with a 50× objective lens, and Sz and Sa values were calculated. When the measured surface was curved, or not flat, in laser microscopy, the measurement results were plane corrected before calculating Sz and Sa. The laser microscopy for the Sz and Sa measurements was performed at an ambient temperature of 23 to 25° C.
Glossiness The carrier-attached ultrathin copper layer, and the base (GHPL-832NX-A manufactured by Mitsubishi Gas Chemical Company) were heat pressed, and laminated at 220° C. for 2 h under the pressure of 20 kgf/cm², and the copper foil carrier was peeled off according to JIS C 6471 1995 to expose the ultrathin copper layer (the copper foil was peeled off according to Method A, Type (1) of the 8.1.1. Test Method in 8.1 Copper Foil Peel Strength (copper foil is peeled off in 90° direction with respect to the copper foil surface being removed)). The MD 60-degree glossiness GMD (MD is the streak direction of the ultrathin copper layer) on the exposed surface of the ultrathin copper layer was then measured according to JIS Z8741, using a handy gloss meter PG-1 (a glossiness meter manufactured by Nippon Denshoku Industries Co., Ltd.) at an incident angle of 60 degrees.
Laser Drillability The untreated surface of the ultrathin copper layer was irradiated with a laser beam, and the hole shape was observed for measurement with a microscope after the laser irradiation. The energy of laser drilling was appropriately adjusted for each sample in a 3 to 7 mJ range for an ultrathin copper layer thickness of 2 µm to achieve a hole size ϕ of 60 µm, a 1 to 5 mJ range for an ultrathin copper layer thickness of 1 µm to achieve a hole size ϕ of 50 µm, and a 3 to 10 mJ range for an ultrathin copper layer thickness of 3 µm to achieve a hole size ϕ of 70 µm. The drilled via was measured at 100 measurement points, and the diameter of a minimum circle around the hole was taken as the hole diameter. A standard deviation was determined from the measured hole diameters, and laser drillability was evaluated according to the following criteria. A laser processing machine ML605GTW4 manufactured by Mitsubishi Electric was used.
Laser Irradiation Conditions
  Laser wavelength: 9.4 µm
  Output: 250 W
  Pulse energy: Appropriately adjusted in a 3 to 7 mJ range
  Pulse width: 10 µs
  Processing mode: Burst mode
  Number of shots: 1
Evaluation Criteria of Laser Drillability
  Standard deviation above 6.0 µm: Poor
  Standard deviation above 4.0 µm and 6.0 µm or less: Acceptable
  Standard deviation above 2.5 µm and 4.0 µm or less: Good
  Standard deviation of 2.5 am or less: Excellent
Circuit Formability: Evaluation of Circuit Skirt Portion after Formation of M-SAP Circuit The carrier-attached copper foil (carrier-attached copper foil after a surface treatment when the ultrathin copper layer is subjected to a surface treatment) was laminated to a bismaleimide triazine resin substrate from the ultrathin copper layer side. After detaching the carrier, a patterned copper plating layer was formed as an M-SAP circuit on the exposed surface of the ultrathin copper layer in a width of 15 µm at an L/S ratio of 15 µm/15 µm for an ultrathin copper layer thickness of 2 µm, in a width of 12 µm at an L/S ratio of 12 µm/12 µm for an ultrathin copper layer thickness of 1 µm, and in a width of 20 µm at an L/S ratio of 20 µm/20 µm for an ultrathin copper layer thickness of 3 µm. This was followed by etching to form a circuit. The etching was performed under the following conditions. The circuit plane was observed at 100 locations where the line length was 1 mm (100 circuit lines with a 1-mm line length), and the length of the skirt portion was measured. Circuit formability was evaluated according to the following criteria with regard to the measured maximum length of the circuit skirt portion. FIG. 5 shows a photograph of an observed circuit plane showing a skirt portion. The skirt portion is a thin etching residue occurring at the bottom of the circuit, as shown in FIG. 5.
Etching Conditions
Type of etching: Spray etching
Spray nozzle: Full cone nozzle
Spray pressure: 0.10 MPa
Etchant temperature: 30° C.
Etchant Composition:
  $H_2O_2$: 18 g/L
  $H_2SO_4$: 92 g/L
  Cu: 8 g/L
  Additive: FE-830IIW3C (manufactured by JCU), used in an appropriate amount
Evaluation Criteria of Circuit Formability
  Defective circuit formation, including multiple shorting between wires, and multiple breaking: Bad
  The maximum length of skirt portion was 5 µm or more, but shorting between wires did not occur: Poor
  The maximum length of skirt portion was 2 µm or more and less than 5 µm: Good
  The maximum length of skirt portion was less than 2 µm: Excellent The test conditions, and the test results are presented in Tables 2 to 4.

TABLE 2

| Experiment No. | | Carrier surface to be provided with ultrathin copper layer, before surface treatment | | | | Surface treatment and processing conditions for carriers | | | |
|---|---|---|---|---|---|---|---|---|---|
| | | Sa (μm) | Sz (μm) | Sz/Sa | MD glossiness GMD mean value (n = 3) | Surface treatment | surface treatment solution | Processing temperature (° C.) | Processing time (s) |
| 1 | Com. Ex. | 0.200 | 2.00 | 10.00 | 190.0 | Etching | Sulfuric acid 500 g/L, hydrogen peroxide 50 g/L, 1,2,3-benzotriazole 5 g/L, remainder: water | 35 | 30 |
| 2 | Com. Ex. | 0.200 | 2.00 | 10.00 | 190.0 | | | 25 | 30 |
| 3 | Com. Ex. | 0.200 | 2.00 | 10.00 | 190.0 | — | — | — | — |
| 4 | Ex. | 0.200 | 2.00 | 10.00 | 190.0 | Etching | Sulfuric acid 100 g/L, potassium persulfate 50 g/L, 1,2,3-benzotriazole 5 g/L, remainder: water | 35 | 10 |
| 5 | Ex. | 0.200 | 2.00 | 10.00 | 190.0 | | | 35 | 60 |
| 6 | Ex. | 0.200 | 2.00 | 10.00 | 190.0 | | | 25 | 10 |
| 7 | Ex. | 0.200 | 2.00 | 10.00 | 190.0 | | | 25 | 60 |
| 8 | Ex. | 0.200 | 2.00 | 10.00 | 190.0 | | Sulfuric acid 20 g/L, hydrogen peroxide 10 g/L, 1,2,3-benzotriazole 1 g/L, remainder: water | 35 | 30 |
| 9 | Ex. | 0.200 | 2.00 | 10.00 | 190.0 | | Sulfuric acid 20 g/L, potassium persulfate 10 g/L, carboxybenzotriazole 1 g/L, remainder: water | 35 | 30 |
| 10 | Ex. | 0.200 | 2.00 | 10.00 | 190.0 | | Sulfuric acid 100 g/L, ammonium persulfate 50 g/L, 1H-1,2,4-triazole 5 g/L, remainder: water | 25 | 5 |
| 11 | Ex. | 0.200 | 2.00 | 10.00 | 190.0 | | Sulfuric acid 100 g/L, hydrogen peroxide 20 g/L, 1,2,3-benzotriazole 5 g/L, remainder: water | 35 | 10 |
| 12 | Ex. | 0.200 | 2.00 | 10.00 | 190.0 | | | 35 | 60 |
| 13 | Ex. | 0.200 | 2.00 | 10.00 | 190.0 | | | 25 | 10 |
| 14 | Ex. | 0.200 | 2.00 | 10.00 | 190.0 | | | 25 | 60 |
| 15 | Com. Ex. | 0.145 | 1.41 | 9.72 | 650.0 | Etching | Sulfuric acid: 10 vol %, hydrogen peroxide: 2.0 wt %, remainder: water | 25 | 60 |
| 16 | Com. Ex. | 0.145 | 1.41 | 9.72 | 650.0 | Reverse electrolytic process | Sulfuric acid 100 g/L, remainder: water Current density: 10 A/dm$^2$ Amount of dissolved copper: 5 g/m$^2$ | — | — |
| 17 | Com. Ex. | 0.200 | 1.41 | 9.72 | 650.0 | — | — | — | — |

| Experiment No. | Carrier surface to be provided with ultrathin copper layer, after surface treatment | | | | Ultrathin copper layer thickness (μm) | Measurement of interlayer side of ultrathin copper layer exposed upon detaching carrier after laminating carrier-attached copper foil to resin | | | | Evaluation results | |
|---|---|---|---|---|---|---|---|---|---|---|---|
| | Sa (μm) | Sz (μm) | Sz/Sa | MD glossiness GMD mean value (n = 3) | | Sa (μm) | Sz (μm) | Sz/Sa | MD glossiness GMD mean value (n = 3) | M-SAP Circuit formability | Brief high-energy laser drillability (1-10 mJ, 10 μs) |
| 1 | 0.290 | 3.43 | 11.84 | 18.9 | 2 | 0.303 | 3.98 | 13.15 | 14.0 | Bad | Excellent |
| 2 | 0.223 | 2.77 | 12.41 | 22.8 | 2 | 0.236 | 3.32 | 14.06 | 17.9 | Poor | Poor |
| 3 | — | — | — | — | 2 | 0.213 | 2.62 | 12.28 | 201.7 | Good | Poor |
| 4 | 0.201 | 2.02 | 10.04 | 88.2 | 2 | 0.214 | 2.57 | 12.00 | 83.3 | Good | Acceptable |
| 5 | 0.279 | 2.95 | 10.58 | 6.7 | 2 | 0.292 | 3.50 | 12.00 | 1.8 | Good | Excellent |
| 6 | 0.175 | 1.78 | 10.19 | 97.8 | 2 | 0.188 | 2.33 | 12.41 | 92.9 | Good | Acceptable |
| 7 | 0.252 | 2.84 | 11.27 | 9.1 | 2 | 0.265 | 3.39 | 12.79 | 4.2 | Good | Excellent |
| 8 | 0.247 | 2.41 | 9.76 | 94.3 | 2 | 0.260 | 2.96 | 11.38 | 89.4 | Good | Acceptable |
| 9 | 0.247 | 2.25 | 9.11 | 143.9 | 2 | 0.260 | 2.80 | 10.77 | 139.0 | Good | Acceptable |

TABLE 2-continued

| 10 | 0.227 | 2.44 | 10.75 | 147.8 | 2 | 0.240 | 2.99 | 12.46 | 142.9 | Good | Acceptable |
| 11 | 0.215 | 2.18 | 10.14 | 59.5 | 2 | 0.228 | 2.73 | 11.98 | 54.6 | Excellent | Good |
| 12 | 0.288 | 3.05 | 10.59 | 10.2 | 2 | 0.301 | 3.60 | 11.96 | 5.3 | Good | Good |
| 13 | 0.204 | 2.11 | 10.35 | 63.9 | 2 | 0.217 | 2.66 | 12.26 | 59.0 | Excellent | Good |
| 14 | 0.254 | 2.61 | 10.26 | 14.5 | 2 | 0.267 | 3.16 | 11.82 | 9.6 | Good | Good |
| 15 | 0.232 | 2.38 | 10.26 | 223.9 | 2 | 0.239 | 2.49 | 10.418 | 218.6 | Excellent | Poor |
| 16 | 0.188 | 2.69 | 14.32 | 51.9 | 2 | 0.181 | 2.58 | 14.254 | 50.3 | Poor | Poor |
| 17 | 0.145 | 1.41 | 9.72 | 650.0 | 2 | 0.147 | 1.43 | 9.7279 | 607 | Excellent | Poor |

TABLE 3

| Experiment No. | | Carrier surface to be provided with ultrathin copper layer, before surface treatment | | | MD glossiness | Surface treatment and processing conditions for carriers | | | |
|---|---|---|---|---|---|---|---|---|---|
| | | Sa (μm) | Sz (μm) | Sz/Sa | GMD mean value (n = 3) | Surface treatment | surface treatment solution | Processing temperature (° C.) | Processing time (s) |
| 18 | Com. Ex | 0.145 | 1.41 | 9.72 | 650.0 | Etching | Sulfuric acid: 10 vol %, hydrogen peroxide: 1.5 wt %, remainder: water | 25 | 60 |
| 19 | Com. Ex. | 0.145 | 1.41 | 9.72 | 650.0 | Reverse electrolytic process | Sulfuric acid 100 g/L, remainder: water Current density: 20 A/dm$^2$ Amount of dissolved copper: 12 g/m$^2$ | — | — |
| 20 | Com. Ex. | 0.153 | 1.69 | 11.05 | 605.0 | Etching | Sulfuric acid: 10 vol %, hydrogen peroxide: 2.0 wt %, remainder: water | 25 | 60 |
| 21 | Ex. | 0.410 | 2.30 | 5.61 | 170.0 | Etching | Sulfuric acid 100 g/L, potassium persulfate 50 g/L, 1,2,3-benzotriazole 5 g/L, remainder: water | 35 | 45 |
| 22 | Com. Ex. | 0.200 | 2.00 | 10.00 | 190.0 | Etching | Sulfuric acid 500 g/L, hydrogen peroxide 50 g/L, 1,2,3-benzotriazole 5 g/L, remainder: water | 35 | 30 |
| 23 | Com. Ex. | 0.200 | 2.00 | 10.00 | 190.0 | | | 25 | 30 |
| 24 | Com. Ex. | 0.200 | 2.00 | 10.00 | 190.0 | — | — | — | — |
| 25 | Ex. | 0.200 | 2.00 | 10.00 | 190.0 | Etching | Sulfuric acid 100 g/L, potassium persulfate 50 g/L, 1,2,3-benzotriazole 5 g/L, remainder: water | 35 | 10 |
| 26 | Ex. | 0.200 | 2.00 | 10.00 | 190.0 | | | 35 | 60 |
| 27 | Ex. | 0.200 | 2.00 | 10.00 | 190.0 | | | 25 | 10 |
| 28 | Ex. | 0.200 | 2.00 | 10.00 | 190.0 | | | 25 | 60 |
| 29 | Ex. | 0.200 | 2.00 | 10.00 | 190.0 | | Sulfuric acid 20 g/L, hydrogen peroxide 10 g/L, 1,2,3-benzotriazole 1 g/L, remainder: water | 35 | 30 |
| 30 | Ex. | 0.200 | 2.00 | 10.00 | 190.0 | | Sulfuric acid 20 g/L, potassium persulfate 10 g/L, carboxybenzotriazole 1 g/L, remainder: water | 35 | 30 |
| 31 | Ex. | 0.200 | 2.00 | 10.00 | 190.0 | | Sulfuric acid 100 g/L, ammonium persulfate 50 g/L, 1H-1,2,4-triazole 5 g/L, remainder: water | 25 | 5 |
| 32 | Ex. | 0.200 | 2.00 | 10.00 | 190.0 | | Sulfuric acid 100 g/L, hydrogen peroxide 20 g/L, 1,2,3-benzotriazole | 35 | 10 |
| 33 | Ex. | 0.200 | 2.00 | 10.00 | 190.0 | | | 35 | 60 |
| 34 | Ex. | 0.200 | 2.00 | 10.00 | 190.0 | | | 25 | 10 |

TABLE 3-continued

| | | | | | | | | | |
|---|---|---|---|---|---|---|---|---|---|
| 35 | Ex. | 0.200 | 2.00 | 10.00 | 190.0 | | 5 g/L, remainder: water | 25 | 60 |
| 36 | Com. Ex. | 0.200 | 2.00 | 10.00 | 190.0 | Etching | Sulfuric acid 500 g/L, hydrogen peroxide 50 g/L, 1,2,3-benzotriazole 5 g/L, remainder: water | 35 | 30 |

| | Carrier surface to be provided with ultrathin copper layer, after surface treatment | | | | Ultrathin copper layer thickness (μm) | Measurement of interlayer side of ultrathin copper layer exposed upon detaching carrier after laminating carrier-attached copper foil to resin | | | | Evaluation results | |
|---|---|---|---|---|---|---|---|---|---|---|---|
| Experiment No. | Sa (μm) | Sz (μm) | Sz/Sa | MD glossiness GMD mean value (n = 3) | | Sa (μm) | Sz (μm) | Sz/Sa | MD glossiness GMD mean value (n = 3) | M-SAP Circuit formability | Brief high-energy laser drillability (1-10 mJ, 10 μs) |
| 18 | 0.165 | 1.69 | 10.24 | 259.2 | 2 | 0.169 | 1.68 | 9.9408 | 250.1 | Excellent | Poor |
| 19 | 0.179 | 2.57 | 14.36 | 28.5 | 2 | 0.176 | 2.52 | 14.318 | 28.1 | Excellent | Poor |
| 20 | 0.187 | 1.89 | 10.107 | 236.9 | 2 | 0.188 | 1.89 | 10.053 | 235 | Excellent | Poor |
| 21 | 0.507 | 2.97 | 5.86 | 10.5 | 2 | 0.520 | 3.52 | 6.77 | 5.6 | Good | Excellent |
| 22 | 0.290 | 3.43 | 11.84 | 18.9 | 1 | 0.298 | 3.91 | 13.12 | 16.0 | Bad | Excellent |
| 23 | 0.223 | 2.77 | 12.41 | 22.8 | 1 | 0.231 | 3.30 | 14.29 | 18.1 | Poor | Poor |
| 24 | — | — | — | — | 1 | 0.211 | 2.59 | 12.29 | 205.0 | Good | Poor |
| 25 | 0.201 | 2.02 | 10.04 | 88.2 | 1 | 0.211 | 2.51 | 11.90 | 85.3 | Good | Acceptable |
| 26 | 0.279 | 2.95 | 10.58 | 6.7 | 1 | 0.287 | 3.48 | 12.13 | 2.8 | Good | Excellent |
| 27 | 0.175 | 1.78 | 10.19 | 97.8 | 1 | 0.183 | 2.31 | 12.62 | 94.5 | Good | Acceptable |
| 28 | 0.252 | 2.84 | 11.27 | 9.1 | 1 | 0.259 | 3.32 | 12.82 | 4.5 | Good | Excellent |
| 29 | 0.247 | 2.41 | 9.76 | 94.3 | 1 | 0.259 | 2.90 | 11.20 | 91.0 | Good | Acceptable |
| 30 | 0.247 | 2.25 | 9.11 | 143.9 | 1 | 0.258 | 2.77 | 10.74 | 141.3 | Good | Acceptable |
| 31 | 0.227 | 2.44 | 10.75 | 147.8 | 1 | 0.240 | 2.99 | 12.46 | 143.1 | Good | Acceptable |
| 32 | 0.215 | 2.18 | 10.14 | 59.5 | 1 | 0.224 | 2.71 | 12.10 | 54.9 | Excellent | Good |
| 33 | 0.288 | 3.05 | 10.59 | 10.2 | 1 | 0.299 | 3.59 | 12.01 | 6.2 | Good | Good |
| 34 | 0.204 | 2.11 | 10.35 | 63.9 | 1 | 0.209 | 2.58 | 12.34 | 59.7 | Excellent | Good |
| 35 | 0.254 | 2.61 | 10.26 | 14.5 | 1 | 0.260 | 3.11 | 11.96 | 10.2 | Good | Good |
| 36 | 0.290 | 3.43 | 11.84 | 18.9 | 3 | 0.311 | 4.03 | 12.96 | 13.5 | Bad | Excellent |

TABLE 4

| | | Carrier surface to be provided with ultrathin copper layer, before surface treatment | | | | Surface treatment and processing conditions for carriers | | | |
|---|---|---|---|---|---|---|---|---|---|
| Experiment No. | | Sa (μm) | Sz (μm) | Sz/Sa | MD glossiness GMD mean value (n = 3) | Surface treatment | surface treatment solution | Processing temperature (° C.) | Processing time (s) |
| 37 | Com. Ex | 0.200 | 2.00 | 10.00 | 190.0 | Etching | Sulfuric acid 500 g/L, hydrogen peroxide 50 g/L, 1,2,3-benzotriazole 5 g/L, remainder: water | 25 | 30 |
| 38 | Com. Ex | 0.200 | 2.00 | 10.00 | 190.0 | — | — | — | — |
| 39 | Ex. | 0.200 | 2.00 | 10.00 | 190.0 | Etching | Sulfuric acid 100 g/L, potassium persulfate 50 g/L, 1,2,3-benzotriazole 5 g/L, remainder: water | 35 | 10 |
| 40 | Ex. | 0.200 | 2.00 | 10.00 | 190.0 | | | 35 | 60 |
| 41 | Ex. | 0.200 | 2.00 | 10.00 | 190.0 | | | 25 | 10 |
| 42 | Ex. | 0.200 | 2.00 | 10.00 | 190.0 | | | 25 | 60 |
| 43 | Ex. | 0.200 | 2.00 | 10.00 | 190.0 | | Sulfuric acid 20 g/L, hydrogen peroxide 10 g/L, 1,2,3-benzotriazole 1 g/L, remainder: water | 35 | 30 |
| 44 | Ex. | 0.200 | 2.00 | 10.00 | 190.0 | | Sulfuric acid 20 g/L, potassium persulfate 10 g/L, carboxybenzotriazole 1 g/L, remainder: water | 35 | 30 |
| 45 | Ex. | 0.200 | 2.00 | 10.00 | 190.0 | | Sulfuric acid 100 g/L, ammonium persulfate 50 g/L, 1H-1,2,4-triazole 5 g/L, remainder: water | 25 | 5 |

TABLE 4-continued

| | | | | | | | | | |
|---|---|---|---|---|---|---|---|---|---|
| 46 | Ex. | 0.200 | 2.00 | 10.00 | 190.0 | | Sulfuric acid 100 g/L, | 35 | 10 |
| 47 | Ex. | 0.200 | 2.00 | 10.00 | 190.0 | | hydrogen peroxide | 35 | 60 |
| 48 | Ex. | 0.200 | 2.00 | 10.00 | 190.0 | | 20 g/L, 1,2,3-benzotriazole | 25 | 10 |
| 49 | Ex. | 0.200 | 2.00 | 10.00 | 190.0 | | 5 g/L, remainder: water | 25 | 60 |
| 50 | Ex. | 0.200 | 2.00 | 10.00 | 190.0 | | Sulfuric acid 100 g/L, | 35 | 10 |
| 51 | Ex. | 0.200 | 2.00 | 10.00 | 190.0 | | potassium persulfate | 35 | 60 |
| 52 | Ex. | 0.200 | 2.00 | 10.00 | 190.0 | | 50 g/L, 1,2,3-benzotriazole | 25 | 10 |
| 53 | Ex. | 0.200 | 2.00 | 10.00 | 190.0 | | 5 g/L, remainder: water | 25 | 60 |
| 54 | Ex. | 0.430 | 3.05 | 7.09 | 78.5 | | Sulfuric acid 20 g/L, | 25 | 60 |
| 55 | Ex. | 0.189 | 1.85 | 9.79 | 143.9 | | hydrogen peroxide | 25 | 60 |
| 56 | Ex. | 0.165 | 1.72 | 10.42 | 231.3 | | 10 g/L, 1,2,3-benzotriazole 10 g/L, remainder: water | 25 | 60 |
| 57 | Com. Ex. | 0.247 | 3.52 | 14.25 | 113.0 | — | — | — | — |
| 58 | Com. Ex. | 0.232 | 3.37 | 14.53 | 124.4 | — | — | — | — |
| 59 | Com. Ex. | 0.180 | 2.55 | 14.17 | 136.1 | — | — | — | — |
| 60 | Com. Ex. | 0.230 | 3.42 | 14.87 | 128.0 | — | — | — | — |
| 61 | Com. Ex. | 0.180 | 2.28 | 12.67 | 575.0 | Etching | Sulfuric acid 10 vol %, hydrogen peroxide: 8.0 wt %, remainder: water | 25 | 60 |

| | Carrier surface to be provided with ultrathin copper layer, after surface treatment | | | | Ultrathin copper layer thickness (μm) | Measurement of interlayer side of ultrathin copper layer exposed upon detaching carrier after laminating carrier-attached copper foil to resin | | | | Evaluation results | |
|---|---|---|---|---|---|---|---|---|---|---|---|
| Experiment No. | Sa (μm) | Sz (μm) | Sz/Sa | MD glossiness GMD mean value (n = 3) | | Sa (μm) | Sz (μm) | Sz/Sa | MD glossiness GMD mean value (n = 3) | M-SAP Circuit formability | Brief high-energy laser drillability (1-10 mJ, 10 μs) |
| 37 | 0.223 | 2.77 | 12.41 | 22.8 | 3 | 0.240 | 3.51 | 14.63 | 17.1 | Poor | Poor |
| 38 | 0.200 | 2.00 | 10.00 | 190.0 | 3 | 0.217 | 2.67 | 12.30 | 197.3 | Good | Poor |
| 39 | 0.201 | 2.02 | 10.04 | 88.2 | 3 | 0.211 | 2.51 | 11.90 | 81.6 | Good | Acceptable |
| 40 | 0.279 | 2.95 | 10.58 | 6.7 | 3 | 0.299 | 3.52 | 11.77 | 1.5 | Good | Excellent |
| 41 | 0.175 | 1.78 | 10.19 | 97.8 | 3 | 0.192 | 2.37 | 12.34 | 91.5 | Good | Acceptable |
| 42 | 0.252 | 2.84 | 11.27 | 9.1 | 3 | 0.259 | 3.32 | 12.82 | 4.0 | Good | Excellent |
| 43 | 0.247 | 2.41 | 9.76 | 94.3 | 3 | 0.266 | 3.01 | 11.32 | 88.8 | Good | Acceptable |
| 44 | 0.247 | 2.25 | 9.11 | 143.9 | 3 | 0.262 | 2.85 | 10.88 | 137.3 | Good | Acceptable |
| 45 | 0.227 | 2.44 | 10.75 | 147.8 | 3 | 0.247 | 3.00 | 12.15 | 141.0 | Good | Acceptable |
| 46 | 0.215 | 2.18 | 10.14 | 59.5 | 3 | 0.231 | 2.77 | 11.99 | 52.5 | Excellent | Good |
| 47 | 0.288 | 3.05 | 10.59 | 10.2 | 3 | 0.307 | 3.63 | 11.82 | 4.2 | Good | Good |
| 48 | 0.204 | 2.11 | 10.35 | 63.9 | 3 | 0.222 | 2.69 | 12.12 | 58.1 | Excellent | Good |
| 49 | 0.254 | 2.61 | 10.26 | 14.5 | 3 | 0.271 | 3.19 | 11.77 | 8.2 | Good | Good |
| 50 | 0.201 | 2.02 | 10.04 | 88.2 | 2 | 0.219 | 2.59 | 11.83 | 82.3 | Good | Acceptable |
| 51 | 0.279 | 2.95 | 10.58 | 6.7 | 2 | 0.299 | 3.53 | 11.81 | 1.5 | Good | Excellent |
| 52 | 0.175 | 1.78 | 10.19 | 97.8 | 2 | 0.181 | 2.30 | 12.71 | 93.9 | Good | Acceptable |
| 53 | 0.252 | 2.84 | 11.27 | 9.1 | 2 | 0.259 | 3.33 | 12.86 | 6.2 | Good | Excellent |
| 54 | 0.521 | 3.16 | 6.07 | 38.6 | 2 | 0.530 | 3.35 | 6.32 | 32.3 | Good | Good |
| 55 | 0.284 | 2.31 | 8.13 | 66.4 | 2 | 0.298 | 2.36 | 7.92 | 63.2 | Excellent | Good |
| 56 | 0.220 | 2.03 | 9.23 | 118.6 | 2 | 0.230 | 2.08 | 9.04 | 117.5 | Excellent | Acceptable |
| 57 | 0.247 | 3.52 | 14.25 | 113.0 | 2 | 0.243 | 3.51 | 14.444 | 108.3 | Poor | Poor |
| 58 | 0.232 | 3.37 | 14.53 | 124.4 | 2 | 0.221 | 3.19 | 14.43 | 120.0 | Poor | Poor |
| 59 | 0.180 | 2.55 | 14.17 | 136.1 | 2 | 0.180 | 2.53 | 14.056 | 131.3 | Poor | Poor |
| 60 | 0.230 | 3.42 | 14.87 | 128.0 | 2 | 0.227 | 3.38 | 14.89 | 124.9 | Poor | Poor |
| 61 | 0.181 | 2.26 | 12.49 | 182.9 | 2 | 0.181 | 2.22 | 12.265 | 179.7 | Excellent | Poor |

What is claimed is:

1. A carrier-attached copper foil comprising an interlayer and an ultrathin copper layer that are provided in this order on one or both surfaces of a carrier,
   wherein the surface roughness Sz and the surface roughness Sa on the interlayer side of the ultrathin copper layer satisfy Sz≤3.6 μm, and Sz/Sa≤14.00 as measured with a laser microscope in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours, and
   wherein GMD, which is a 60-degree glossiness of the ultrathin copper layer surface on the interlayer side in MD direction, satisfies GMD≤150 in case of detaching the carrier from the carrier-attached copper foil according to JIS C 6471:1995 after the carrier-attached copper foil is laminated using the same procedure.

2. The carrier-attached copper foil according to claim 1, wherein the GMD, a 60-degree glossiness of the ultrathin copper layer surface on the interlayer side in MD direction, satisfies GMD≤80 in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

3. The carrier-attached copper foil according to claim 1, wherein the GMD, a 60-degree glossiness of the ultrathin copper layer surface on the interlayer side in MD direction, satisfies GMD≤70 in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

4. The carrier-attached copper foil according to claim 1, wherein the GMD, a 60-degree glossiness of the ultrathin copper layer surface on the interlayer side in MD direction, satisfies GMD≤65 in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

5. The carrier-attached copper foil according to claim 1, wherein the GMD, a 60-degree glossiness of the ultrathin copper layer surface on the interlayer side in MD direction, satisfies GMD≤5 in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

6. The carrier-attached copper foil according to claim 1, wherein the surface roughness Sz and the surface roughness Sa on the interlayer side of the ultrathin copper layer satisfy Sz/Sa≤10.50 as measured with a laser microscope in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

7. The carrier-attached copper foil according to claim 1, wherein the surface roughness Sz and the surface roughness Sa on the interlayer side of the ultrathin copper layer satisfy Sz/Sa≤9.50 as measured with a laser microscope in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

8. The carrier-attached copper foil according to claim 1, wherein the surface roughness Sz on the interlayer side of the ultrathin copper layer satisfies 0.01 μm≤Sz as measured with a laser microscope in case of detaching the carrier from the carrier-attached copper foil according to JIS C 6471: 1995 after the carrier-attached copper foil is laminated to an insulating substrate from the ultrathin copper layer side under a pressure of 20 kgf/cm² and heated at 220° C. for 2 hours.

9. The carrier-attached copper foil according to claim 1, wherein the surface roughness Sz and the surface roughness Sa on the interlayer side of the ultrathin copper layer satisfy 1.00≤Sz/Sa as measured with a laser microscope in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

10. The carrier-attached copper foil according to claim 1, wherein the GMD, a 60-degree glossiness of the ultrathin copper layer surface on the interlayer side in MD direction, satisfies 0.01≤GMD in case of detaching the carrier from the carrier-attached copper foil according to JIS C 6471:1995 after the carrier-attached copper foil is laminated to an insulating substrate from the ultrathin copper layer side under a pressure of 20 kgf/cm² and heated at 220° C. for 2 hours.

11. The carrier-attached copper foil according to claim 1, which comprises one or more layers selected from the group consisting of a roughening treatment layer, a heat-resistant layer, an antirust layer, a chromate treated layer, and a silane coupling process layer,
   the one or more layers being provided on at least one of the surfaces on the side of the ultrathin copper layer and on the side of the carrier when the carrier-attached copper foil of claim 1 has the ultrathin copper layer on one surface of the carrier, and
   the one or more layers being provided on one or both surfaces on the ultrathin copper layer side when the carrier-attached copper foil of claim 1 has the ultrathin copper layer on the both surfaces of the carrier.

12. The carrier-attached copper foil according to claim 1, which comprises a resin layer on the ultrathin copper layer.

13. The carrier-attached copper foil according to claim 11, which comprises a resin layer on the one or more layers selected from the group consisting of a roughening treatment layer, a heat-resistant layer, an antirust layer, a chromate treated layer, and a silane coupling process layer.

14. A method for producing a laminate using the carrier-attached copper foil of claim 1.

15. A laminate comprising the carrier-attached copper foil of claim 1, and a resin, wherein the resin covers end surfaces of the carrier-attached copper foil either in part or as a whole.

16. A laminate comprising a first carrier-attached copper foil laminated from the carrier side or the ultrathin copper layer side to the carrier side or the ultrathin copper layer side of a second carrier-attached copper foil, the first and the second carrier-attached copper foils being the carrier-attached copper foil of claim 1.

17. The laminate according to claim 16, wherein end surfaces of the laminate are covered with a resin either in part or as a whole.

18. A method for producing a printed wiring board, the method using a laminate produced by using the method of claim 14.

* * * * *